United States Patent
Xue et al.

(10) Patent No.: US 9,112,164 B2
(45) Date of Patent: Aug. 18, 2015

(54) HIGH EFFICIENCY ORGANIC PHOTOVOLTAIC CELLS EMPLOYING HYBRIDIZED MIXED-PLANAR HETEROJUNCTIONS

(71) Applicant: THE TRUSTEES OF PRINCETON UNIVERSITY, Princeton, NJ (US)

(72) Inventors: Jiangeng Xue, Gainesville, FL (US); Soichi Uchida, Yokohama (JP); Barry P. Rand, Princeton, NJ (US); Stephen Forrest, Ann Arbor, MI (US)

(73) Assignee: The Trustees of Princeton University, Princeton, NJ (US)

(*) Notice: Subject to any disclaimer, the term of this patent is extended or adjusted under 35 U.S.C. 154(b) by 0 days.

(21) Appl. No.: 14/068,430

(22) Filed: Oct. 31, 2013

(65) Prior Publication Data
US 2014/0053898 A1    Feb. 27, 2014

Related U.S. Application Data

(60) Division of application No. 10/910,371, filed on Aug. 4, 2004, now Pat. No. 8,586,967, which is a continuation-in-part of application No. 10/822,774, filed on Apr. 13, 2004, now abandoned.

(51) Int. Cl.
*H01L 51/00* (2006.01)
*H01L 51/42* (2006.01)
(Continued)

(52) U.S. Cl.
CPC ............ *H01L 51/4246* (2013.01); *B82Y 10/00* (2013.01); *H01L 31/0256* (2013.01); *H01L 51/4253* (2013.01); *H01L 51/0037* (2013.01); *H01L 51/0046* (2013.01);
(Continued)

(58) Field of Classification Search
USPC ................ 257/40, 94, 96; 313/503, 504, 506
See application file for complete search history.

(56) References Cited

U.S. PATENT DOCUMENTS

5,587,444 A * 12/1996 Uchida et al. ................ 526/247
6,559,375 B1    5/2003 Meissner et al.
(Continued)

OTHER PUBLICATIONS

Crandall, R.S., "Modeling of thin film solar cells: Uniform field approximation", Journal of Applied Physics, 1983, 54(12):7176-7186.
(Continued)

*Primary Examiner* — Thomas L Dickey
(74) *Attorney, Agent, or Firm* — Duane Morris LLP

(57) ABSTRACT

A device is provided, having a first electrode, a second electrode, and a photoactive region disposed between the first electrode and the second electrode. The photoactive region includes a first photoactive organic layer that is a mixture of an organic acceptor material and an organic donor material, wherein the first photoactive organic layer has a thickness not greater than 0.8 characteristic charge transport lengths; a second photoactive organic layer in direct contact with the first organic layer, wherein the second photoactive organic layer is an unmixed layer of the organic acceptor material of the first photoactive organic layer, and the second photoactive organic layer has a thickness not less than about 0.1 optical absorption lengths; and a third photoactive organic layer disposed between the first electrode and the second electrode and in direct contact with the first photoactive organic layer. The third photoactive organic layer is an unmixed layer of the organic donor layer of the first photoactive organic layer and has a thickness not less than about 0.1 optical absorption lengths.

19 Claims, 12 Drawing Sheets

(51) Int. Cl.
*B82Y 10/00* (2011.01)
*H01L 31/0256* (2006.01)

(52) U.S. Cl.
CPC ........ *H01L 51/0059* (2013.01); *H01L 51/0078* (2013.01); *Y02E 10/549* (2013.01)

(56) References Cited

U.S. PATENT DOCUMENTS

| | | | |
|---|---|---|---|
| 6,657,378 B2 | 12/2003 | Forrest et al. | |
| 6,670,213 B2 | 12/2003 | Hall et al. | |
| 2003/0039803 A1 | 2/2003 | Burroughes | |
| 2003/0042846 A1* | 3/2003 | Forrest et al. | 313/503 |
| 2004/0067324 A1 | 4/2004 | Lazarev et al. | |

OTHER PUBLICATIONS

Schroder, D.K., Semiconductor Material and Device Characterization, (John Wiley & Sons, Inc. 2nd Ed., 1998), pp. 594-597.
Gebeyehu, et al., "Highly efficient p-i-n type organic photovoltaic devices," Thin Solid Films, 2004, 451-452:29-32.
Wong, et al, "Low-band-gap, sublimable rhenium (I) dimine complex for efficient bulk heterojunction photovoltaic devices," Appl. Phys. Lett., 2004, 84(14):2557-2559.
International Search Report dated Oct. 31, 2005, Application No. PCT/US05/12846.
Peumans et al., "Small Molecular Weight Organic Thin-Film Photodetectors and Solar Cells," Journal of Applied Physics, vol. 93, No. 7, pp. 3693-3723 (Apr. 1, 2003).
C. W. Tang, "Two-layer organic photovoltaic cell", Appl. Phys. Lett., vol. 48, No. 2, pp. 183-185 (Jan. 1986).
A. Yakimov, et al., "High photovoltage multiple-heterojunction organic solar cells incorporating interfacial metallic nanoclusters", Appl. Phys. Lett., vol. 80, No. 9, pp. 1667-1669 (Mar. 4, 2002).
P. Peumans et al., "Very-high-efficiency double-heterostructure copper phthalocyanine/C60 photovoltaic cells", Appl. Phys. Lett., vol. 79, No. 1, pp. 126-128 (Jul. 2, 2001).
S. E. Shaheen et al., "2.5% efficient organic plastic solar cells", Appl. Phys. Lett., vol. 78, No. 6, pp. 841-843 (Feb. 5, 2001).
P. Peumans et al., "Efficient bulk heterojunction photovoltaic cells using small-molecular-weight organic thin films", Nature, vol. 425, pp. 158-162 (Sep. 11, 2003).
D. Gebeyehu et al., "Bulk-heterojunction photovoltaic devices based on donor acceptor organic small molecule blends", Solar Energy Mater. Solar Cells, 79, pp. 81-92 (2003).
Xue et al., "4.2% efficient organic photovoltaic cells with low series resistances", Appl. Phys. Lett., vol. 84, No. 16, pp. 3013-3015 (Apr. 19, 2004).
M. Hiramoto, et al., "Three-layered organic solar cell with a photoactive interlayer of codeposited pigments", Appl. Phys. Lett. 58 (10), pp. 1062-1064 (Mar. 11, 1991).
Forrest, "Ultrathin Organic Films Grown by Organic Molecular Beam Deposition and Related Techniques", Chem Rev., vol. 97, No. 6, pp. 1793-1896 (1997).
Sullivan, et al., "Influence of codeposition on the performance of CuPc-C60 heterojunction photovoltaic devices", Appl. Phys. Lett., vol. 84, No. 7, pp. 1210-1212 (Feb. 16, 2004).
Burrows et al., "Relationship between electroluminescence and current transport in organic heterojunction light-emitting devices", J. Appl. Phys. 79(10), pp. 7991-8006 (May 15, 1996).
Xue et al., "Carrier transport in multilayer organic photodetectors: II. Effects of anode preparation", J. Appl. Phys., vol. 95, No. 4, pp. 1869-1877 (Feb. 15, 2004).
Paasch et al., "Variable range hopping as possible origin of a universal relation between conductivity and mobility in disordered organic semiconductors", Synthetic Metals, 132, pp. 97-104 (2002).
G Ruani et al., "Weak instrinsic charge transfer complexes: A new route for developing wide spectrum organic photovoltaic cells", J. Chem Phys., vol. 116, No. 4, pp. 1713-1719 (Jan. 22, 2002).
M. Hiramoto, et al., "p-i-n like behavior in three-layered organic solar cells having a co-deposited interlayer of pigments", J. Appl. Phys., 72 (8), pp. 3781-3787, Oct. 15, 1992.

G. Yu, et al., "Polymer Photovoltaic Cells: Enhanced efficiencies via a network of internal donor-acceptor heterojunctions", Science, vol. 270, pp. 1789-1791 (Dec. 15, 1995).
F. Padinger, et al., "Effects of postproduction treatment on plastic solar cells", Adv. Funct. Mater., 13, No. 1, pp. 85-88 (Jan. 2003).
T. Tsuzuki, et al., "The effect of fullerene doping on photoelectric conversion using titanyl phthalocyanine and a perylene pigment", Solar Energy Mater. Solar Cells, 61, pp. 1-8, (2000).
J. Rostalski, et al., "Monochromatic versus solar efficiencies of organic solar cells", Solar Energy Mater. Solar Cells, 61, pp. 87-95 (2000).
Ch. Pannemann, et al., "Electrical characterisation of phthalocyanine-fullerene photovoltaic devices" Synth. Met., 121, pp. 1585-1586 (2001).
Ot. E. Sielcken, et al., "Synthesis and Aggregation Behavior of Hosts Containing Phthalocyanine and Crown Either Subunits", J. Am. Chem. Soc., 109, pp. 4261-4265 (1987).
V. Bulovic et al., "Study of localized and extended excitons in 3,4,9,10-perylenetetracarboxylic dianhydride (PTCDA) II. Photocurrent response at low electric fields", Chem. Phys. 210, pp. 13-25, 1996.
B. A. Gregg et al., "Long-Range singlet energy transfer in perylene Bis(phenethylimide) films", J. Phys. Chem. B, 101, pp. 5362-5369, 1997.
T. Stübinger et al., "Exciton diffusion and optical interference in organic donor-acceptor photovoltaic cells", J. Appl. Phys., vol. 90, No. 7, pp. 3632-3641, Oct. 1, 2001.
H. R. Kerp and E. E. van Faassen, "Photovoltaic yield from exciton dissociation in organic dye layers", Phys. Chem. Chem. Phys., 1999, 1, pp. 1761-1763.
L. A. A. Pettersson et al., "Modeling photocurrent action spectra of photovoltaic devices based on organic thin films", J. Appl. Phys., vol. 86, No. 1, pp. 487-496, Jul. 1, 1999.
A. L. Burin et al., "Exciton migration and cathode quenching in organic light emitting diodes", J. Phys. Chem. A, 104, pp. 4704-4710, 2000.
V. E. Choong et al., "Photoluminescence quenching of Alq3 by metal deposition: A surface analytical investigation", J. Vac. Sci. Technol. A 16 (3), pp. 1838-1841, May/Jun. 1998.
J. J. M. Halls et al., "Exciton diffusion and dissociation in a poly(p-phenylenevinylene)/C60 heterojunction photovoltaic cell", Appl. Phys. Lett. 68(22), pp. 3120-3122, May 27, 1996.
M. Theander et al., "Photoluminescence quenching at a polythiophene/C60 heterojunction", Phys. Rev. B, vol. 61, No. 19, pp. 12 957-12 963, May 15, 2000.
P. Peumans, et al., "Influence of Device Architecture and Interface Morphology on the Power Conversion Efficiency of Small Molecular Photovoltaic Cells", NCPV and Solar Program Review Meeting 2003, pp. 435-437.
B. Maennig, et al., "Orgainic p-i-n solar cells", Appl. Phys. A. 79 (2004), pp. 1-14, Mar. 5, 2004.
Pradhan et al., "Molecular level control of donor/acceptor heterostructures in organic photovoltaic devices," Applied Physics Letters, vol. 85, No. 4, pp. 663-665 (Jul. 26, 2004).
Halls, et al., Efficient photodiodes from interpenetrating polymer networks, Nature (London), vol. 376, No. 6540, pp. 498-500 (Aug. 10, 1995).
Uchida et al., "Organic Small Molecule Solar Cells with a Homogenously Mixed Copper Phthalocyanine: C60 Active Layer", Appl. Phys. Lett, vol. 84, pp. 4218, (2004).
<http://www.oksolar.com/solar_panels/unisolar_flexibles.htm>, "Uni-solar Flexible (USF) Unbreakable Solar Panels—Triple Junction", printed Sep. 4, 2004.
"UNI-POWER Solar Electric Modules Specification Sheet, Models US-64, US-42, US-32", printed from the OKSolar.com website on Sep. 14, 2004.
"Amorphous Silicon (a-Si) Solar Technology", printed from United Solar Ovonic Corp. website on Sep. 14, 2004, <http:www.uni-solar.com/Our_Technology_a_Si.html>.

(56) References Cited

OTHER PUBLICATIONS

S. Guha, et al., "Amorphous Silicon Alloy Photovoltaic Research Present and Future", Progress in Photovoltaics: Research and Applications, Prog. Photovolt. Res. Appl. 8, pp. 141-150, 2000.

Drechsel et al., "High efficiency organic solar cells based on single or multiple PIN structures", Thin Solid Films, Mar. 2004, 451-452:515-517.

Examiner's Report issued Dec. 18, 2013, in counterpart Canadian Patent Application No. 2,562,939.

* cited by examiner

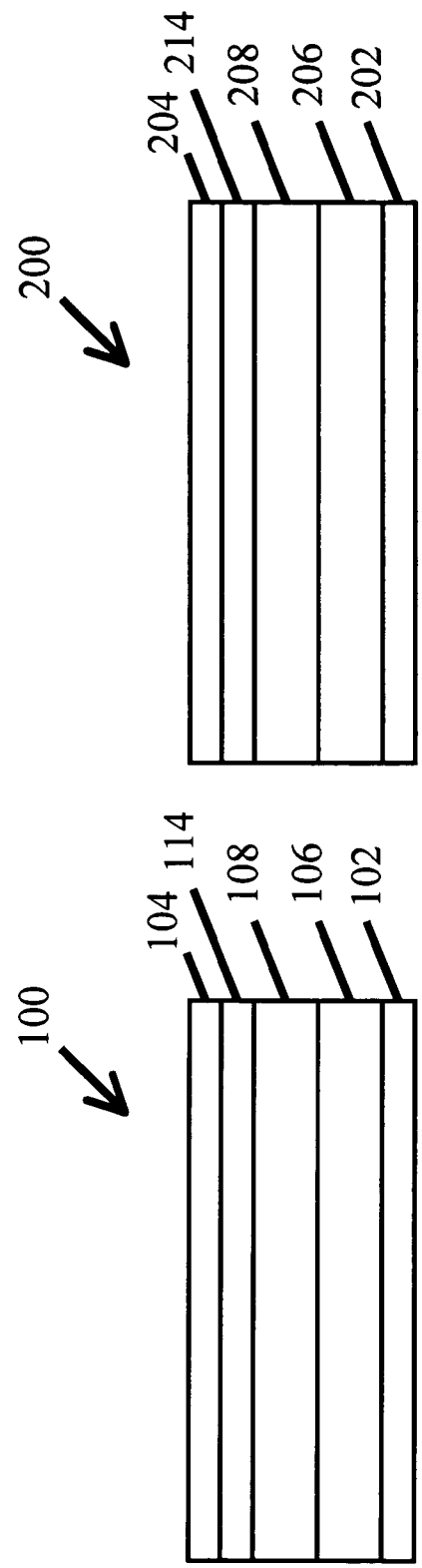

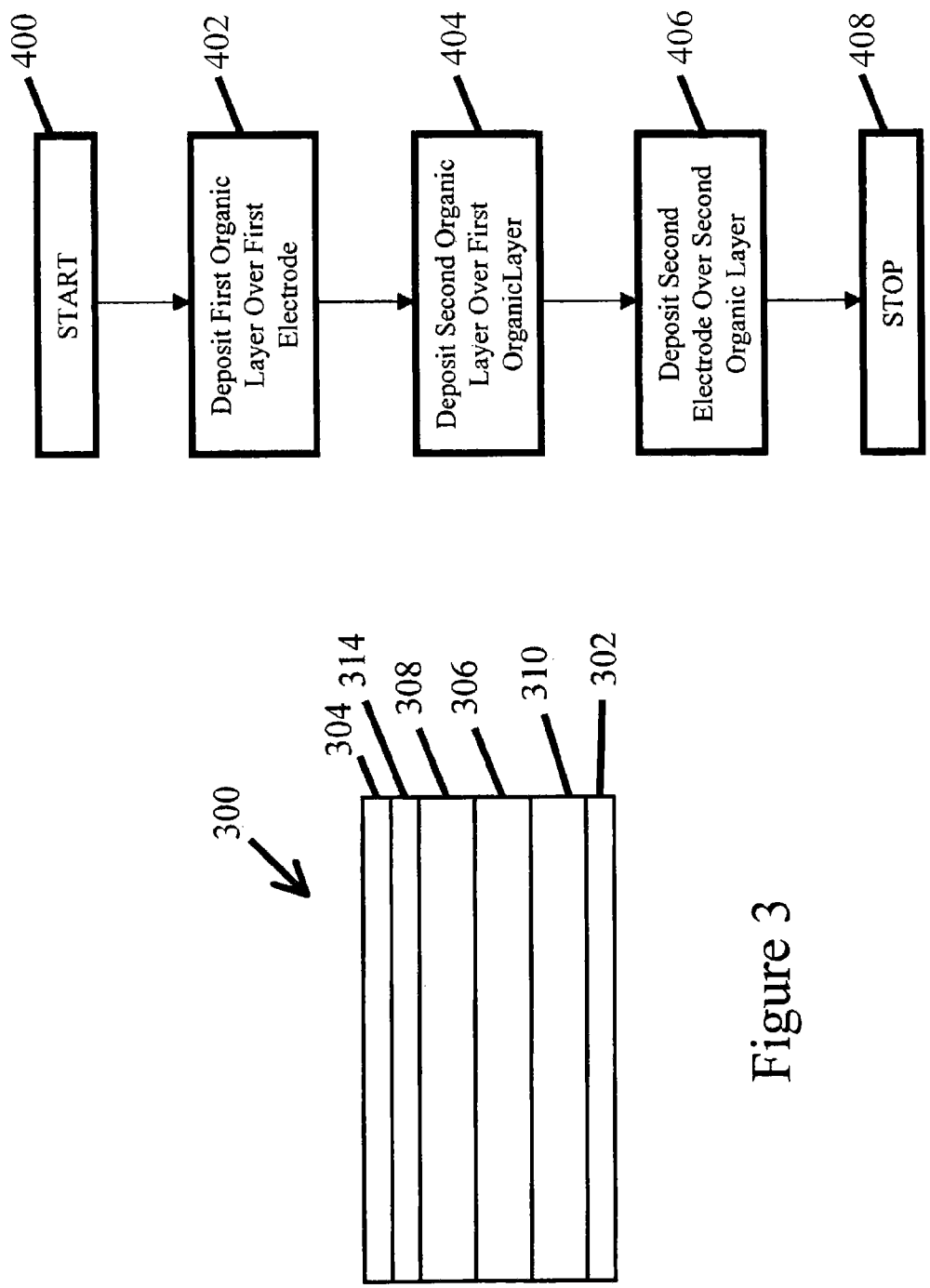

HIGH EFFICIENCY ORGANIC PHOTOVOLTAIC CELLS EMPLOYING HYBRIDIZED MIXED-PLANAR HETEROJUNCTIONS

CROSS-REFERENCE TO RELATED APPLICATIONS

This application is divisional application of U.S. application Ser. No. 10/910,371, filed on Aug. 4, 2004, which is a continuation-in-part of U.S. application Ser. No. 10/822,774, filed on Apr. 13, 2004, the disclosures of which are incorporated herein by reference in their entirety.

GOVERNMENT RIGHTS

This invention was made with government support under Grant No. F49620-03-1-0410 awarded by the U.S. Air Force Office of Scientific Research and Grant No. ACQ-1-30619-05 (Prime DE-AC36-99GO10337) awarded by the National Renewable Energy Laboratory of the U.S. Department of Energy. The government has certain rights in the invention.

JOINT RESEARCH AGREEMENT

The claimed invention was made by, on behalf of, and/or in connection with one or more of the following parties to a joint university corporation research agreement: Regents of the University of Michigan, Princeton University, University of Southern California, Global Photonic Energy Corporation, and the Universal Display Corporation. The agreement was in effect on and before the date the claimed invention was made, and the claimed invention was made as a result of activities undertaken within the scope of the agreement.

FIELD OF THE INVENTION

The present invention relates to efficient organic photosensitive devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic transistors/phototransistors, organic photovoltaic cells, and organic photodetectors. For OLEDs, the organic materials may have performance advantages over conventional (i.e., inorganic) materials. For example, the wavelength at which an organic emissive layer emits light may generally be readily tuned with appropriate dopants. For organic transistors/phototransistors, the substrates upon which they are constructed may be flexible, providing for broader applications in industry and commerce.

As used herein, the term "organic" includes polymeric materials as well as small molecule organic materials that may be used to fabricate organic devices including opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. Small molecules generally have a well defined molecular weight, whereas polymers generally do not have a well defined molecular weight.

General background information on small molecular weight organic thin-film photodetectors and solar cells may be found in Peumans et al., "Small Molecular Weight Organic Thin-Film Photodetectors and Solar Cells," Journal of Applied Physics-Applied Physics Reviews-Focused Review, Vol. 93, No. 7, pp. 3693-3723 (April 2003).

The "fill factor" (FF) of a solar cell is $P_{max}/(Jsc*Voc)$, where $P_{max}$ is the maximum power of the solar cell, determined by finding the point on the I-V curve for which the product of the current and voltage is a maximum. A high FF is an indication of how "square" the I-V curve for a solar cell appears.

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Photovoltaic (PV) devices or solar cells, which are a type of photosensitive optoelectronic device, are specifically used to generate electrical power. PV devices, which may generate electrical power from light sources other than sunlight, are used to drive power consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. As used herein the term "resistive load" refers to any power consuming or storing device, equipment, or system. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector has a voltage applied and a current detecting circuit measures the current generated when the photodetector is exposed to electromagnetic radiation. A detecting circuit as described herein is capable of providing a bias voltage to a photodetector and measuring the electronic response of the photodetector to ambient electromagnetic radiation. These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

A need exists for an organic photovoltaic cells with a higher efficiency.

SUMMARY OF THE INVENTION

A device is provided, having a first electrode, a second electrode, and a photoactive region disposed between the first electrode and the second electrode. The photoactive region includes a first organic layer comprising a mixture of an organic acceptor material and an organic donor material, wherein the first organic layer has a thickness not greater than 0.8 characteristic charge transport lengths, and a second organic layer in direct contact with the first organic layer, wherein the second organic layer comprises an unmixed layer of the organic acceptor material or the organic donor material of the first organic layer, and the second organic layer has a thickness not less than about 0.1 optical absorption lengths. Preferably, the first organic layer has a thickness not greater than 0.3 characteristic charge transport lengths. Preferably, the second organic layer has a thickness of not less than about 0.2 optical absorption lengths. Embodiments of the invention can be capable of power efficiencies of 2% or greater, and preferably 5% or greater.

BRIEF DESCRIPTION OF THE DRAWINGS

FIG. 1 is a schematic diagram of an organic photovoltaic cell in accordance with an embodiment of the invention.

FIG. 2 is a schematic diagram of another organic photovoltaic cell in accordance with an embodiment of the invention.

FIG. 3 is a schematic diagram of yet another organic photovoltaic cell in accordance with an embodiment of the invention.

FIG. 4 illustrates a method of making an organic photovoltaic cell in accordance with an embodiment of the invention.

FIG. 5 shows an energy level diagram of a device.

DETAILED DESCRIPTION

Figure 5:
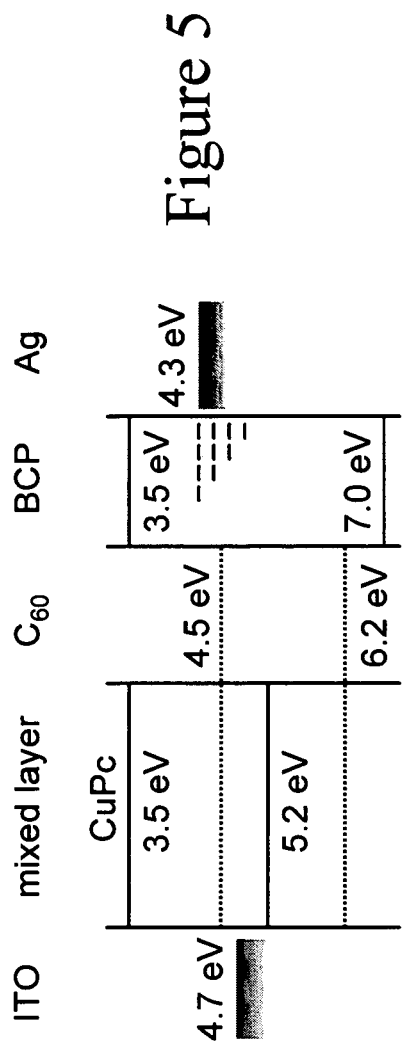
FIG. 5 shows

Organic photovoltaic (PV) cells have attracted considerable attention due to their potential for low cost solar or ambient energy conversion. Early results, with an organic PV cell based on a single donor-acceptor (D-A) heterojunction, resulted in a 1%-efficient thin-film. See C. W. Tang, *Appl. Phys. Lett.* 48, 183 (1986). The power conversion efficiency, $\eta_P$, has steadily improved since then through the use of new materials and device structures. See P. Peumans et al., *J. Appl. Phys.* 93, 3693 (2003); A. Yakimov and S. R. Forrest, *Appl. Phys. Lett.* 80, 1667 (2002); P. Peumans and S. R. Forrest, *Appl. Phys. Lett.* 79, 126 (2001); S. E. Shaheen et al., *Appl. Phys. Lett.* 78, 841 (2001); P. Peumans et al., Nature (London) 425, 158 (2003). In particular, $\eta_P=(3.6\pm0.2)$ % under 1 sun (100 mW/cm$^2$) AM1.5G simulated solar illumination was achieved in a double heterostructure copper phthalocyanine (CuPc)/$C_{60}$ thin-film cell. P. Peumans and S. R. Forrest, *Appl. Phys. Lett.* 79, 126 (2001). However, these single heterojunction devices are limited in that the "active region" of the device, i.e. the region in which absorbed photons may contribute to photocurrent, is limited to the region from which excitons excited by photons can diffuse with a reasonable probability to the single heterojunction.

Donor (D)—acceptor (A) bulk heterojunctions (BHJs) may be used to improve the efficiencies of both polymer and small molecule-based photovoltaic (PV) cells. Because the external quantum efficiency ($\eta_{EQE}$) of an organic D-A bilayer structure is often limited by a short exciton diffusion length, the BHJ has been suggested as a means to overcome this limitation, resulting in improved $\eta_{EQE}$ and power conversion efficiency ($\eta_P$). Such a BHJ can consist of a blended thin film of a donor-like phthalocyanine (Pc) and the acceptor-like $C_{60}$. Recently, $\eta_P=3.37$% has been reported under 0.1 sun (10 mW/cm$^2$, AM1.5) illumination in a mixed $ZnPc:C_{60}$ PV cell. See D. Gebeyehu et al., *Solar Energy Mater. Solar Cells*, 79, 81 (2003). Unfortunately, that device had a large cell series resistance ($R_s$), resulting in a reduced short circuit current density ($J_{SC}$), and hence the power efficiency fell to =1.04% at 1 sun intensity. The reason for this large $R_s$ may be attributed to the presence of resistive organic layers including poly(3, 4-ethylenedioxythiophene):poly(styrenesul-fonate) (PEDOT:PSS) and, more importantly, their contact resistances. On the other hand, recent results show that a CuPc/$C_{60}$ bilayer device with a very low $R_s$ shows a significant improvement in $\eta_P$, especially at higher illumination intensity, achieving a maximum power efficiency of =(4.2±0.2) % at 4 to 12 suns. See, Xue et al., *Appl. Phys. Lett.*, 84, 3013 (2004).

Referring now in detail to the drawings, there is illustrated in FIG. 1 a schematic diagram of an organic photovoltaic cell 100 in accordance with an embodiment of the invention. Device 100 may include a first electrode 102, a first organic layer 106, a second organic layer 108, a third organic layer 114, and a second electrode 104, disposed in that order over a substrate. First organic layer 106 comprises a mixture of an organic acceptor material and an organic donor material. Second organic layer 108 comprises the organic acceptor material of first organic layer 106, but does not include the donor material of first organic layer 106. Second organic layer 108 has a thickness of between about 0.5 exciton diffusion length and about 10 exciton diffusion lengths. Preferably, organic layer 108 has a thickness of about 1 to 10 exciton diffusion lengths. As a result, first organic layer 106 acts a bulk heterojunction, in which photogenerated excitons may dissociate into electrons and holes. Second organic layer 108 may be photoactive in the sense that it absorbs photons to produce excitons that may later contribute to photocurrent, but these excitons may first diffuse to the heterojunction of first organic layer 106. Third organic layer 114 comprises an exciton blocking layer, comprised of materials selected to prevent excitons from exiting second organic layer 108 into third organic layer 114. Third organic layer 114 may be referred to as a non-photoactive organic layer, because it may not be responsible for absorbing photons that contribute significantly to photocurrent.

FIG. 2 is a schematic diagram of another organic photovoltaic cell 200 in accordance with an embodiment of the invention. Device 200 may include a first electrode 202, a first organic layer 206, a second organic layer 208, and a second electrode 204, disposed in that order over a substrate. First organic layer 206 comprises a mixture of an organic acceptor material and an organic donor material. Second organic layer 208 comprises the organic donor material of first organic layer 206, but does not include the acceptor material of first organic layer 206. Second organic layer 208 has a thickness of between about 0.5 exciton diffusion length and about 10 exciton diffusion lengths, and preferably between about 1 and 10 exciton diffusion lengths. As a result, first organic layer 206 acts a bulk heterojunction, in which photogenerated excitons may dissociate into electrons and holes. Second organic layer 208 may be photoactive in the sense that it absorbs photons to produce excitons that may later contribute to photocurrent, but these excitons may first diffuse to the heterojunction of first organic layer 206. Third organic layer 214 comprises an exciton blocking layer, comprised of materials selected to prevent excitons from exiting second organic layer 208 into third organic layer 214.

Examples of diffusion lengths for various organic acceptor and donor materials are illustrated in Table 1, below:

TABLE 1

Reported Exciton Diffusion Lengths.

| Material[a] | Diffusion Length, $L_D$ (Å) | Technique | Ref. |
|---|---|---|---|
| Small Molecule Systems | | | |
| PTCBI | 30 ± 3 | PL quenching | P. Peumans, A Yakimov and S. Forrest, J. App. Phys., vol. 93, no. 7, Apr. 1, 2003, p. 3702 (Peumans et al.) |
| PTCDA | 880 ± 60 | from $\eta_{EQE}$ | V. Bulovic and S. R. Forrest, Chem. Phys. 210, 13, 1996. |
| PPEI | ~700[b] | PL quenching | B. A. Gregg e al., J. Phys. Chem. B 101, 5362, 1997. |
| CuPc | 100 ± 30 | from $\eta_{EQE}$ | Peumans et al |
|  | 680 ± 200 | from $\eta_{EQE}$ | T. Stübinger and W. Brütting, J. Appl. Phys. 90, 3632, 2001. |
| ZnPc | 300 ± 100 | from $\eta_{EQE}$ | H. R. Kerp and E. E. van Faassen, Nord. Hydrol. 1, 1761, 1999. |
| $C_{60}$ | 400 ± 50 | from $\eta_{EQE}$ | Peumans et al. |
|  | 141 | from $\eta_{EQE}$ | L. A. A. Pettersson et al., J. Appl. Phys. 86, 487, 1999. |
| $Alq_3$ | 200 |  | A. L. Burin and M. A. Ratner, J. Phys. Chem. A 104, 4704, 2000. |
|  | ~200 |  | V. E. Choong et al. J. Vac. Sci. Technol. A 16, 1838, 1998. |
| Polymer Systems | | | |
| PPV | 70 ± 10 | from $\eta_{EQE}$ | J. J. M. Halls et al., Appl. Phys. Lett. 68, 3120, 1996. |
|  | 120 ± 30[c] | from $\eta_{EQE}$ | T. Stübinger and W. Brütting, J. Appl. Phys. 90, 3632, 2001. |
| PEOPT | 47 | from $\eta_{EQE}$ | L. A. A. Pettersson et al., J. Appl. Phys. 86, 487, 1999. |
|  | 50 | PL quenching | M. Theander et al. Phys. Rev. B 61, 12 957, 2000. |

[a]PPEI = perylene bis(phenethylimide), $Alq_3$ = tris(8-hydroxyquinoline) aluminum.
[b]Using the result for the $SnO_2$ quenching surface and assuming infinite surface recombination velocity. The results leading to $L_D^{PPEI}$ = 2.5 ± 0.5 μm are likely influenced by quencher diffusion and morphological changes during solvent vapor assisted annealing.
[c]Optical interference effects not considered.

It will be understood that the listing of organic materials in Table 1, above, is exemplary and not meant to be limiting. Other materials having similar or different diffusion lengths may be used without departing from the scope of the invention. Furthermore, it will be understood that the diffusion lengths listed in Table 1 are not meant to restrict the invention disclosed herein to only those listed lengths. Other lengths, whether by virtue of the use of other materials or by virtue of different methods of determination, calculations, or measurements of diffusion lengths of materials identified hereinabove, may be used without departing from the scope of the invention.

In one embodiment, the mixture of the organic acceptor material and the organic donor material in a mixed organic layer, such as first organic layer 106 (or 206) may occur in a ratio ranging from about 10:1 to about 1:10 by weight, respectively. In one embodiment, an organic layer including a mixture of acceptor and donor materials (such as first organic layer 106), and an organic layer that includes only an acceptor material or a donor material (such as second organic layer 108 or 208) may each contribute 5 percent or more, and preferably 10 percent or more, of the total energy output of the photoactive device. In one embodiment, an organic layer including a mixture of acceptor and donor materials (such as first organic layer 106 or 206), and an organic layer that includes only an acceptor material or a donor material (such as second organic layer 108 or 208) may each absorb 5 percent or more, and preferably 10 percent or more, of the energy incident on the photoactive device. A layer that has a lower percentage of contribution to energy and/or absorption may not be considered as significantly participating as a part of the photoactive region of the device. In one embodiment, the organic acceptor material may be selected from a group consisting of: fullerenes; perylenes; catacondensed conjugated molecular systems such as linear polyacenes (including anthracene, napthalene, tetracene, and pentacene), pyrene, coronene, and functionalized variants thereof. In one embodiment, the organic donor material may be selected from a group consisting of: metal containing porphyrins, metal-free porphyrins, rubrene, metal containing phthalocyanines, metal-free phthalocyanines, diamines (such as NPD), and functionalized variants thereof, including naphthalocyanines. This listing is not meant to be comprehensive, and other suitable acceptor and donor materials may be used. In one embodiment, the first organic layer 206 may consist essentially of a mixture of CuPc and $C_{60}$. In one embodiment, the photoactive device 100, 200 may further comprise a third organic layer 114, 214 that may be disposed between the second electrode 104, 204 and the second organic layer 108, 208, and may be a non-photoactive layer. In one embodiment, third organic layer 114, 214 may comprise 2,9-dimethyl-,7-diphenyl-1,10-phenanthrolin (BCP). In one embodiment, the third organic layer 114, 214 may be an exciton blocking layer. In one embodiment, the first electrode 102, 202 may be comprised of indium tin oxide or other conductive oxide. In one embodiment, the second electrode 104, 204 may be comprised of Ag, LiF/Al, Mg:Ag, Ca/Al, and other metals. Other material selections may be used.

Where a layer is described as an "unmixed" acceptor or donor layer, the "unmixed" layer may include very small amounts of the opposite material as an impurity. A material may be considered as an impurity if the concentration is significantly lower than the amount needed for percolation in the layer, i.e., less than about 5% by weight. Preferably, any impurity is present in a much lower amount, such as less than 1% by weight or most preferably less than about 0.1% by weight. Depending upon the processes and process parameters used to fabricate devices, some impurities of the materials in immediately adjacent layers be unavoidable.

Preferably, blocking layers are transparent to the wavelengths of light absorbed by the photoactive region. Blocking layers preferably readily accept injection of and conduct the type of charge carrier that may be traveling through them—for example, a blocking layer disposed on the acceptor side of a photoactive region, disposed between the acceptor material and an electrode, should readily accept injection of electrons from the acceptor, and should readily conduct electrons.

A layer is described as "photoactive" if photons absorbed by that layer make a significant contribution to the photocurrent of the device. A device may have a photoactive region comprising several photoactive layers. In various embodiments of the invention, the photoactive region comprises a plurality of photoactive layers, including a layer that is a mixture of acceptor and donor materials, as well as a layer that includes only an acceptor or a donor material, but not both (although impurities may be present as discussed above). A device that combines a mixed photoactive layer with one or more unmixed photoactive layer may be referred to as a hybrid device, because it combines favorable properties of planar HJ devices (a D-A interface with no mixed layer), with favorable properties of a mixed layer device (a mixed D-A layer with no unmixed A or D layer, or only minimal unmixed layers of the A and D materials).

FIG. 3 is a schematic diagram of yet another organic photovoltaic cell 300 in accordance with an embodiment of the invention. Device 300 may include a first electrode 302, a third organic layer 310, a first organic layer 306, a second organic layer 308, a fourth organic layer 314, and a second electrode 304, disposed in that order over a substrate. First organic layer 306 comprises a mixture of an organic acceptor material and an organic donor material. Second organic layer 308 comprises the organic acceptor material of first organic layer 306, but does not include the donor material of first organic layer 306. Second organic layer 308 has a thickness of between about 0.5 exciton diffusion length and about 10 exciton diffusion lengths, and preferably between about 1 and 10 exciton diffusion lengths. Third organic layer 310 comprises the organic donor material of first organic layer 306, but does not include the acceptor material of first organic layer 306. Second organic layer 310 has a thickness of between about 0.5 exciton diffusion length and about 10 exciton diffusion lengths, and preferably between about 1 and 10 exciton diffusion lengths. As a result, first organic layer 306 acts as a bulk heterojunction, in which photogenerated excitons may dissociate into electrons and holes. Second organic layer 308 and third organic layer 310 may be photoactive in the sense that they absorbs photons to produce excitons that may later contribute to photocurrent, but these excitons may first diffuse to the heterojunction of first organic layer 306. Fourth organic layer 314 comprises an exciton blocking layer, comprised of materials selected to prevent excitons from exiting second organic layer 308 into third organic layer 314. Fourth organic layer 314 may be referred to as a non-photoactive organic layer, because it may not be responsible for absorbing photons that contribute significantly to photocurrent.

Preferred parameters for the embodiment of FIG. 3, such as layer thicknesses, material selections, proportions of materials in first organic layer 306 (the mixed layer), relative amounts of incident energy absorbed, and relative amount of total energy output, are similar to those for FIGS. 1 and 2.

In various embodiments of the invention, there is an organic layer that includes a mixture of an acceptor and a donor material (such as layers 106, 206, and 306), and at least one layer that includes only the donor or acceptor material from the mixed layer (such as layers 108, 208, 308 and 310). When the device absorbs a photon, an exciton may be created. The exciton may then dissociate and contribute to photocurrent if it is able to reach an appropriately designed heterojunction. A layer that includes a mixture of acceptor and donor material provides a bulk heterojunction, such that there is favorably a large volume over which such dissociation may occur. However, such a layer may have lower conductivity than an unmixed layer, and lower conductivity is undesirable. Conductivity issues are aggravated by thicker layers, so there is a limit on the thickness that such a mixed layer may have if a reasonable conductivity is desired.

A layer that includes only an acceptor or a donor may favorably have a higher conductivity than a mixed layer. However, there is no heterojunction in such a layer, such that excitons formed by the absorption of a photon need to travel to a heterojunction in order to efficiently dissociate. As a result, there is also a limit on the useful thickness of unmixed layers in a solar cell, but the limit may be related more to the diffusion length of excitons as opposed to conductivity issues.

In addition, a thick photoactive region is desirable, because a thicker photoactive layer may absorb more photons that may contribute to photocurrent than a thinner photoactive layer.

Various embodiments of the invention provide a device that combines the favorable properties of a device having a bulk heterojunction (such as mixed layer 106, 206 or 306), but no unmixed layer, with the favorable properties of a device that does not have a bulk heterojunction—i.e., a device having a pure acceptor layer that forms a planar junction with a pure donor layer. The mixed and the unmixed layers are each a part of the photoactive region, such that the thicknesses add for purposes of absorbing more photons. Greater thicknesses of layers that contribute to photocurrent may therefore be achieved than with a device where the photoactive region includes only a mixed layer or only unmixed layers, or where most of the thickness is due to only a mixed layer or only unmixed layers. Or, a device with a lower resistance for a given thickness of the photoactive region may be achieved.

In a preferred embodiment of the invention, a layer or layers that include only a single acceptor or donor material, but not a mixture of the two, such as layers 108, 208, 308 and 310, may be selected to have high conductivity, while being able to contribute to the photocurrent. Excitons that are formed by a photon absorbed in such a layer must diffuse to a heterojunction in order to contribute to photocurrent. As a result, a thickness for such a layer that is about 0.5 exciton diffusion lengths to about 10 exciton diffusion lengths is preferred, and more preferably about 1 to 10 exciton diffusion lengths. For layers having a thickness that is greater than about 10 diffusion lengths, any additional thickness may not make a significant contribution to photocurrent, because photons absorbed too far from a heterojunction are unable to reach a heterojunction.

At the lower boundary of the unmixed photoactive layers, optical absorption is a more important parameter than exciton diffusion length. The "optical absorption length" of a material is the length in which incident light intensity is reduced to (1/e), or about 37%. Typical absorption lengths for organic photoactive materials are in the range 500-1000 Å. For CuPc, the optical absorption length is 500 Å. for wavelengths in the range 500 nm-700 nm. For $C_{60}$, the optical absorption length is 1000 Å. for a wavelength of 450 nm. In order for a layer to contribute significantly to photocurrent, the layer thickness should be at least a significant fraction of an absorption length. Preferably, the thickness of a photoactive layer, such as an unmixed organic photoactive layer, is not less than about 0.1 absorption lengths, and more preferably is not less than about 0.2 absorption lengths. For smaller thicknesses, the layer may not make a significant contribution to photocurrent.

In a preferred embodiment of the invention, a layer than includes a mixture of acceptor and donor materials, such as layers 106, 206 and 306, include 10% or more of an acceptor material and 10% or more of a donor material. It is believed that 10% is the lower limit at which there is enough material for percolation. Percolation is desirable in both the acceptor and donor materials, because it allows photogenerated electrons and holes that result from dissociation anywhere in the mixed layer to reach the appropriate electrodes by traveling through the acceptor and donor, respectively, without traveling through the opposite (donor or acceptor) layer. Preferably, the unmixed layers in the photoactive region comprise one of the materials that is present in the mixed layer, to avoid any HOMO/LUMO mismatch for charge carriers that are percolating through the mixed layer and reach an unmixed layer.

D-A phase separation is needed for efficient carrier collection in both polymer and small molecule-based BHJ solar cells. On the other hand, the $CuPc:C_{60}$ mixed layer shows a large $\eta_P$ comparable to optimized bilayer devices employing the same materials, contrary to CuPc: 3,4,9,10-peryrenetetracarboxylic bis-benzimidazole mixed layer devices that required annealing and phase separation to improve efficiency. See, Peumans et al., Nature, 425, 158 (2003). Indeed, following a similar annealing procedure for $CuPc:C_{60}$ mixed layer cells results in a significant reduction in $\eta_P$. This suggests that a mixed $CuPc:C_{60}$ system may undergo phase separation during the deposition process itself, such that the mixed layer is a percolating network of both materials, provided that the concentrations of both materials is above the percolation threshold.

Unmixed organic donor-acceptor heterojunctions may be used to provide efficient photo-generation of charge carriers upon absorption of incident light. The efficiency of this type of cell may be limited by the poor ability of excitons (i.e., bound electron-hole pairs) to diffuse to the donor-acceptor interface. A mixed layer, i.e., a donor-acceptor mixture, may be used to alleviate this problem by creating a spatially distributed donor-acceptor interface that is accessible to every photogenerated exciton generated in the mixed layer. However, since charge mobility may be significantly reduced in a mixture as compared to a homogeneous film, recombination of photogenerated holes and electrons is more likely to happen in a mixture, leading to incomplete collection of charge carriers.

In one embodiment of the invention, a preferred microstructure for a molecular donor-acceptor mixture is provided. A mixed layer having the preferred microstructure may be used in photosensitive devices that either have or do not have one or more unmixed photoactive layers. An example of the preferred microstructure is described with respect to a mixture of CuPc and $C_{60}$, although other donor and acceptor materials may be used. The preferred microstructure includes percolating paths for hole and electron transport through the mixed donor-acceptor layer, with each path only one or a few molecules wide. Preferably, the width of the path is 5 molecules wide or less, and more preferably 3 molecules wide or less. Photogenerated charges may be efficiently transported along such paths to their respective electrodes without significant recombination with their countercharges. The interpenetrating network of donor and acceptor materials forms a nanostructured, spatially distributed donor-acceptor interface for efficient exciton diffusion and subsequent dissociation.

The preferred microstructure was demonstrated in a $CuPc:C_{60}$ mixture, 1:1 ratio by weight, prepared by vacuum thermal evaporation. In the mixture, it was found that the charge transport length, i.e., the mean distance that charges travel before recombination with their counter charges, when no bias was applied, was about 40 nm, on the same order of the optical absorption length. It is believed that no pure donor or acceptor domains exist in the CuPc mixture. The lack of such pure domains is preferred. The tendency of CuPc aggregation was reduced by increasing the content of $C_{60}$ in the layer.

Figure 16:
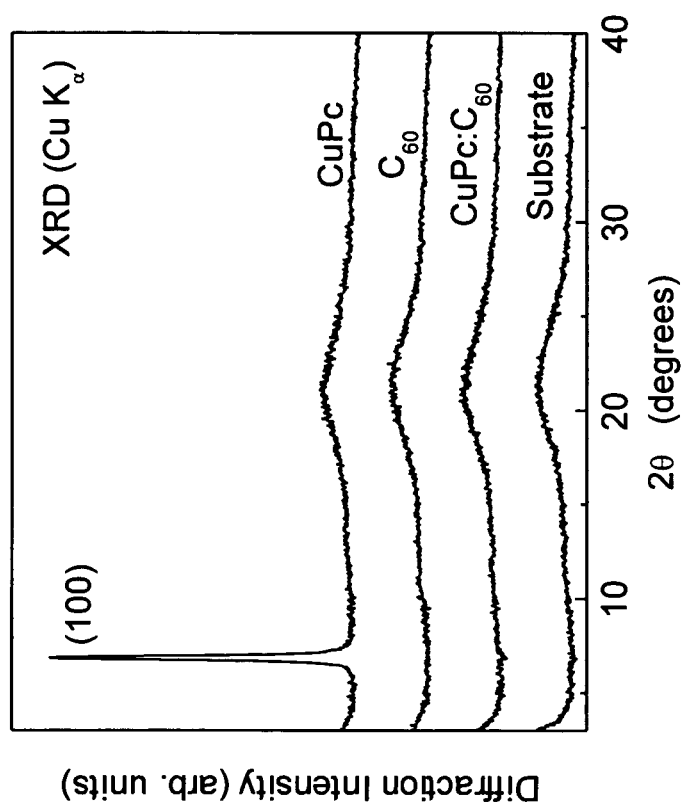
FIG. 16 shows X-ray diffraction results for homogeneous and mixed CuPc and $C_{60}$ films.

X-ray diffraction was performed to study the crystal structure of homogeneous and mixed CuPc and $C_{60}$ films, as shown in FIG. 16. It was found that a homogeneous CuPc film is polycrystalline, while a homogeneous $C_{60}$ film is amorphous. A mixed $CuPc:C_{60}$ film, 1:1 ratio by weight, is also amorphous, indicating that no significant phase separation occurs. By "no significant phase separation," it is meant that there is no aggregation measurable by presently available measurement techniques. The most sensitive of these techniques at the present time is believed to be measurement with a synchrotron x-ray source (e.g., Brookhaven), which is capable of measuring aggregates 5 molecules wide and up. Note that these definitions of "no significant phase separation" and "aggregation" does not exclude the possibility of interpercolating strings of molecules that may be many molecules long.

Figure 8:
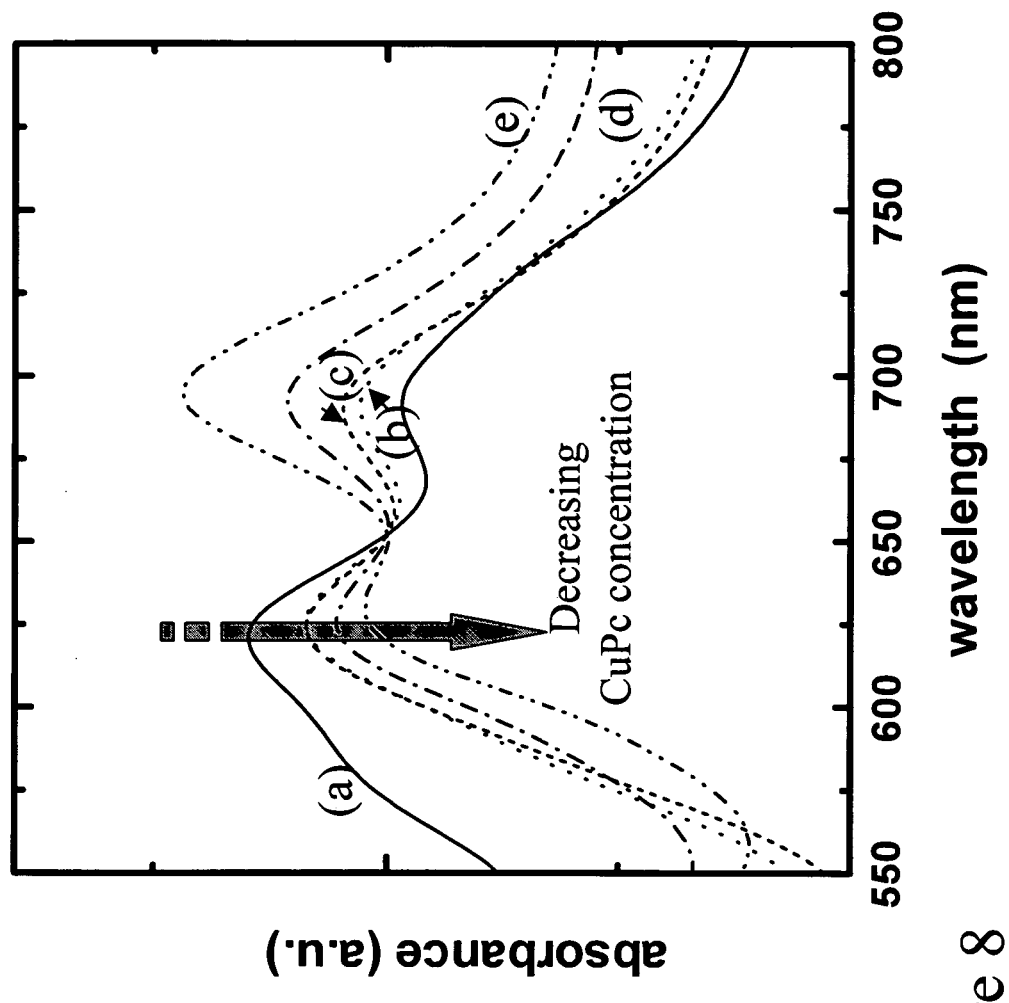
FIG. 8 shows absorption spectra of $CuPc:C_{60}$ films with various mixture ratios, deposited on ITO.

Optical absorption spectra were measured for mixed $CuPc:C_{60}$ films with different mixing ratios, as shown in FIG. 8. From the dependence of the relative intensities of the two CuPc absorption peaks (around 620 nm and 690 nm) on the mixing ratio, it was found that CuPc molecules show a reduced tendncy to aggregate with increasing $C_{60}$ content.

Figure 13:
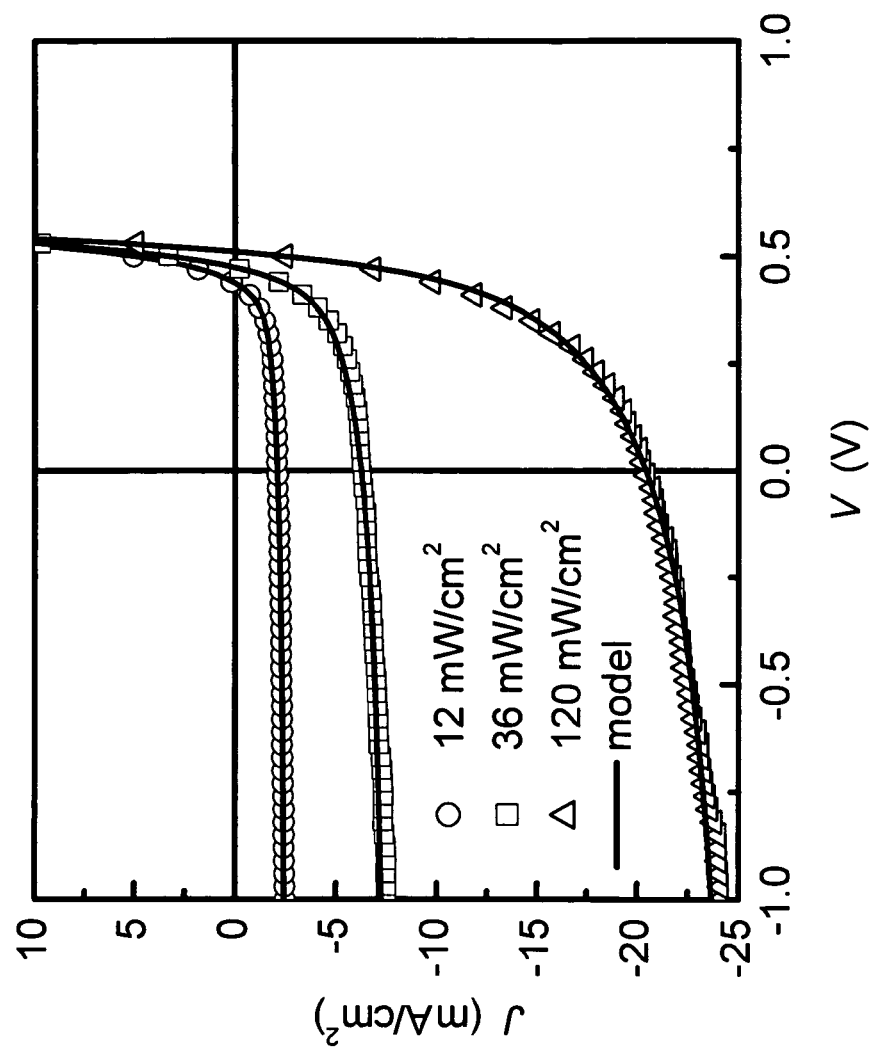
FIG. 13 shows experimental J-V characteristics at various $P_O$ for a hybrid device with a mixed layer thickness of 200 Å.

Organic photovoltaic cells with a mixed $CuPc:C_{60}$ layer sandwiched between homogeneous CuPc and $C_{60}$ layers were fabricated, to form a hybrid planar-mixed heterojunction photovoltaic cell, and tested under simulated AM1.5G solar illumination. The photoactive region of the cell had 15 nm CuPc/10 run $CuPc:C_{60}$ (1:1 ratio by weight)/35 nm $C_{60}$. The cell had a photocurrent as high as a cell having a single 33 nm thick mixed photoactive layer, and a charge collection efficiency as high as a cell without a mixed layer (i.e., a planar heterojunction cell). A maximum power conversion efficiency of 5.0% under 1 to 4 suns simulated AM1.5G solar illumination was obtained, compared to 3.5% for the mixed layer cell under 1 to 4 suns (3.6% under 1 sun), and 4.2% under 4 to 12 suns for the planar heterojunction cell. Fitting the current-voltage characteristics of the hybrid planar-mixed heterojunction cells under illumination using a model based on the charge transport length, a charge transport length of 40 nm was obtained for the cells under short-circuit conditions (as shown in FIG. 13), which is on the same order of magnitude as the optical absorption length. A CuPc:PTCBI (3,4,9, 10-perylenetetracarboxyloc bis-benzimidazole) mixed layer has a charge transport length estimated at less than 5-10 nm, for comparison.

Although various embodiments are described with respect to undoped organic layers, it is understood that dopants may be added to the various organic layers in order to increase conductivity and/or to modify the light absorption characteristics of the doped organic layer to advantageously impact device or layer performance.

It is understood that the embodiments illustrated in FIGS. 1-3 are exemplary only, and that other embodiments may be used in accordance with the present invention. Any photovoltaic cell having both a mixed organic layer that includes both an acceptor material and a donor material, as well as an adjacent layer that includes only an acceptor material or a donor material, where both the mixed layer and the unmixed layer contribute significantly to photocurrent, would be within the scope of embodiments of the invention. For example, the order of the layers illustrated in FIGS. 1-3 may be altered. For example, in FIGS. 1 and 2, the positions of the photoactive layers, i.e., first organic layer 106 (or 206) and second organic layer 108 (or 208) may be switched, with appropriate repositioning of blocking layers, etc. Additional layers may or may not also be present, such as blocking layers, charge recombination layers, etc. For example, blocking layers may be removed, i.e., third organic layer 114 or fourth organic layer 314, and/or additional blocking layers may be present (such as a blocking layer between first organic layer 106 and underlying first electrode 104). Various solar cell configurations may be used, such as tandem solar cells. Different materials than those specifically described may be used. For example, a device where all of the electrodes are ITO may be fabricated such that the device may be transparent to some degree. Additionally, the device could be fabricated onto a substrate, and then applied to a supporting surface, such that the last electrode deposited is closest to the supporting surface. Although many embodiments are described with respect to solar cells, other embodiments may be used in other types of photosensitive devices having a D-A heterojunction, such as a photodetector.

FIG. 4 illustrates a method of making an organic photovoltaic cell in accordance with an embodiment of the invention. The method begins at step 400. At step 402, a first organic layer may be deposited over a first electrode. The first organic layer may be a mixed layer, including both an organic acceptor material and an organic donor material. At step 404, a second organic layer over may be deposited over the first organic layer. The second organic layer maybe an unmixed layer, including either the organic acceptor material or the organic donor material of the first organic layer, but not both. The organic layers may be deposited by any suitable method, including thermal evaporation (or coevaporation for multiple materials) and OVPD. At step 406, a second electrode may be deposited over the second organic layer. The method may end at step 408.

In one embodiment of the invention, an efficient organic solar cell with a vacuum co-deposited donor-acceptor copper phthalocyanine (CuPc):$C_{60}$ mixed layer is provided. A device with a structure of indium tin oxide/330 Å CuPc:$C_{60}$ (1:1)/ 100 Å $C_{60}$/75 Å. 2,9-dimethyl-4,7-diphenyl-1,10-phenanthrolin/Ag was fabricated. The device had a series resistance of only $R_S=0.25\Omega\cdot cm^2$, resulting in a current density of ~1 A/cm$^2$ at a forward bias of +1 V, and a rectification ratio of $10^6$ at ±1 V. Under simulated solar illumination (all simulated solar spectra described herein were AM1.5G simulated solar spectrum), the short circuit current density increases linearly with light intensity up to 2.4 suns. A maximum power conversion efficiency was measured of $\eta_P=(3.6\pm0.2)$ % at 0.3 suns and $\eta_P=(3.5\pm0.2)$ % at 1 sun. Although the fill factor decreases with increasing intensity, a power efficiency as high as $\eta_P=(3.3\pm0.2)$ % is observed at 2.4 suns intensity.

In another embodiment of the invention, an efficient solar cell is provided. A device is provided with the structure: indium-tin-oxide/150 Å CuPc/100 Å CuPc:$C_{60}$ (1:1 by weight)/350 Å $C_{60}$/100 Å bathocuproine/1000 Å Ag. This photovoltaic cell exhibited a maximum power conversion efficiency of $(5.0\pm0.2)$ % under 1 to 4 suns of simulated AM1.5G solar illumination.

The power efficiencies achieved by embodiments of the invention are higher than any other previously achieved for organic solar cells. These surprising results are due to interactions between several features of embodiment of the invention, including the use of an unmixed organic photoactive layer in connection with a mixed organic photoactive layer, with thicknesses selected with efficiency in mind. Embodiments of the invention are capable of power efficiencies of 2%, 3.5%, or 5%, or greater. It is expected that with refinement and optimization of devices consistent with embodiments of the invention, even higher power efficiencies may be achieved.

One parameter to consider in selecting the thickness of the mixed layer is the characteristic charge transport length L, which can be considered as the average distance an electron or a hole travels in the mixed layer under an electric field before being recombined. If the thickness of the mixed layer is too great, many of the charge carriers will recombine as opposed to generating photocurrent. Selecting the thickness of the mixed layer is therefore a tradeoff among several factors, including the desire for a thick layer to increase absorption, and the desire for a thin layer to avoid recombination. It is preferred that the thickness of the mixed layer be not greater than about 0.8 characteristic charge transport lengths, and more preferably not greater than about 0.3 characteristic charge transport lengths. For some of the specific embodiments described herein that use a CuPc:$C_{60}$ (1:1) mixed layer, the characteristic charge transport length of the mixed layer is about 45 nm. Excellent efficiencies were obtained for devices having mixed layer thicknesses of 330 Å and 100 Å.

A device disclosed in FIG. 1 of Hiromoto, *Three-layered organic solar cell with a photoactive interlayer of codeposited pigments*, Appl. Phys. Lett. 58 (10) (1991) has a mixed layer with a characteristic charge transport length of about 40 nm, and the layer thickness is about 1 characteristic charge transport length. As a result, recombination in the mixed layer of that device may account in part for the low device efficiency.

Photovoltaic characteristics of MPc:$C_{60}$ mixed devices of various structures are summarized in Table 2.

TABLE 2

| Structure (Å) | $P_0$ (mW/cm$^2$) | $J_{SC}$ (mA/cm$^2$) | $J_{SC}/P_0$ (A/W) | $V_{OC}$ (V) | FF | $\eta_P$ (%) |
|---|---|---|---|---|---|---|
| ITO/370 CuPc:$C_{60}$ (1:1)/ 75 BCP/Ag | 100 | 12.3 ± 0.6 | 0.12 | 0.53 | 0.43 | 2.8 ± 0.1 |
| ITO/330 CuPc:$C_{60}$ (1:1)/ 100 $C_{60}$/75 BCP/Ag | 10 | 1.6 ± 0.1 | 0.16 | 0.43 | 0.51 | 3.5 ± 0.2 |
|  | 27 | 4.2 ± 0.2 | 0.16 | 0.47 | 0.49 | 3.6 ± 0.2 |
|  | 100 | 15.4 ± 0.7 | 0.15 | 0.50 | 0.46 | 3.5 ± 0.2 |
| ITO/300 CuPc:$C_{60}$ (1:2)/ 100 $C_{60}$/75 BCP/Ag | 100 | 11.1 ± 0.5 | 0.11 | 0.54 | 0.44 | 2.6 ± 0.1 |
| ITO/150 CuPc/ 00 CuPc:$C_{60}$ (1:1)/350 $C_{60}$/ 100 BCP/1000 Ag | 100 |  |  | 0.5 | 0.6 | 5.0 ± 0.2 |

TABLE 2-continued

| Structure (Å) | $P_O$ (mW/cm$^2$) | $J_{SC}$ (mA/cm$^2$) | $J_{SC}/P_0$ (A/W) | $V_{OC}$ (V) | FF | $\eta_P$ (%) |
|---|---|---|---|---|---|---|
| ITO/PEDOT:PSS/ 500 m-MTDATA/ 500 ZnPc:C$_{60}$(1:2)/500 MPP/ 10 LiF/Al | 10 100 | 1.5 6.3 | 0.15 0.063 | 0.45 0.50 | 0.5 0.33 | 3.37 1.04 | where $P_O$ is incident light intensity,
$J_{SC}$ is short circuit current density,
$V_{OC}$ is open circuit voltage,
FF is fill factor
$\eta_P$ is power conversion efficiency,
MPP is N,N'-dimethyl-3,4:9,10-perylene bis(dicarboximde),
m-MTDATA is 4,4',4"-tris(3-methylphenylphenylamino)triphenylamine.

The simplest mixed structure of ITO/370 Å CuPc:C$_{60}$/75 Å BCP/Ag shows a large $J_{SC}$=(12.0±0.6) mA/cm$^2$ at 1 sun, comparable to an optimized bilayer device using the same combination of donor and acceptor materials. See Xue et al., Appl. Phys Lett., 84, 3013 (2004). However, $\eta_P$=(2.8±0.1) % observed in this mixed device is smaller than in an optimized bilayer due to a reduced fill factor, FF<0.5, vs FF~0.6 in the bilayer device. See, id. Both $J_{SC}$ and $\eta_P$ are further improved with the addition of a thin (100 Å) C$_{60}$ layer between the CuPc:C$_{60}$ and BCP layers. It is believed that, by displacing the active region farther from the reflective metal cathode, the additional C$_{60}$ layer results in an increased optical field at the D-A interface. See, Peumans et al., J. Appl. Phys., 93, 3693 (2003). A device with an optimized CuPc:C$_{60}$ thickness of 330 Å shows that $J_{SC}$=(15.2±0.7) mA/cm$^2$ and $\eta_P$=(3.5±0.2) % at 1 sun. In this case, $J_{SC}$ is approximately 20% larger than that of the bilayer device at 1 sun, and $\eta_P$ is roughly equal to that of the bilayer device at 1 sun.

Experimental and Calculations

Photovoltaic devices were fabricated on 1300 Å thick layers of indium tin oxide (ITO) precoated onto glass substrates. The solution cleaned ITO surface was exposed to ultraviolet/O$_3$ prior to deposition. The organic source materials: CuPc, C$_{60}$ and 2,9-dimethyl-4,7-diphenyl-1,10-phenanthroline (BCP) are purified by thermal gradient sublimation, also prior to use, as described in Forrest, Chem. Rev., 97, 1793 (1997). All organic materials were thermally evaporated in high vacuum (<10$^{-6}$ Torr) using quartz crystal monitors to determine film thickness and deposition rate. The mixture ratio of CuPc to C$_{60}$ based on the wt % measured using the thickness monitor is fixed at 1:1, unless otherwise noted. The Ag cathodes were evaporated through a metal shadow mask with 1 mm diameter openings. The current density—voltage (J-V) characteristics were measured in the dark and under illumination of AM1.5G simulated solar spectrum from a filtered Xe arc lamp source. Illumination intensities were measured using a calibrated power meter.

FIG. 5 shows an energy level diagram the device. A homogeneous D:A mixed film allows for both electron and hole transport to the contacts, in addition to efficient exciton dissociation. By deposition of a Ag cathode on BCP, defect states are created that transport electrons efficiently from C$_{60}$ to the metal cathode, while effectively blocking hole and exciton transport. At the anode, the CuPc:C$_{60}$ mixed layer was deposited directly onto the pre-cleaned ITO surface.

Figure 6:
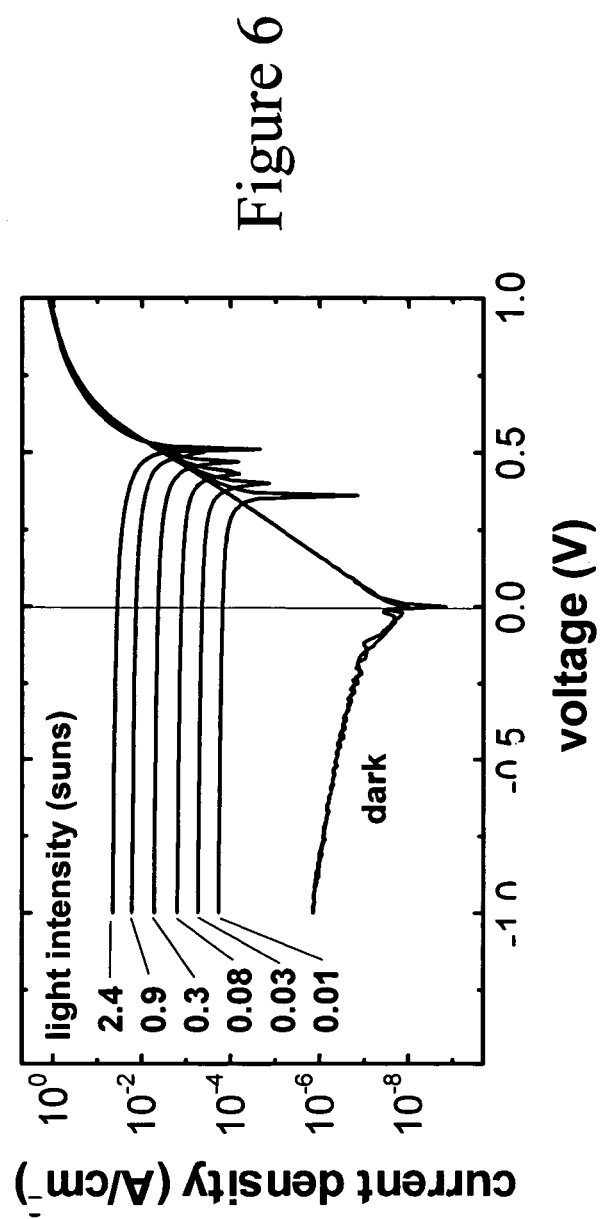
FIG. 6 shows J-V characteristics of a hybrid device

FIG. 6 shows J-V characteristics of a hybrid device with a structure of ITO/330 Å CuPc:C$_{60}$/100 Å C$_{60}$/75 Å BCP/Ag, in the dark and under various illumination intensities of AM1.5G simulated solar spectrum. Specifically, J-V characteristics are provided for in the dark, and at light intensities of 0.01 suns, 0.03 suns, 0.08 suns, 0.3 suns, 0.9 suns, and 2.4 suns. The dark J-V characteristics show a rectification ratio of ~10$^6$ at ±1 V, and the forward current at +1 V is >1 Å/cm$^2$, indicating a low series resistance of $R_S$=0.25Ω·cm$^2$ as obtained by fitting the J-V characterstics according to a modified ideal diode equation. See, Xue et al., Appl. Phys. Lett., 84, 3013 (2004).

Figure 7:
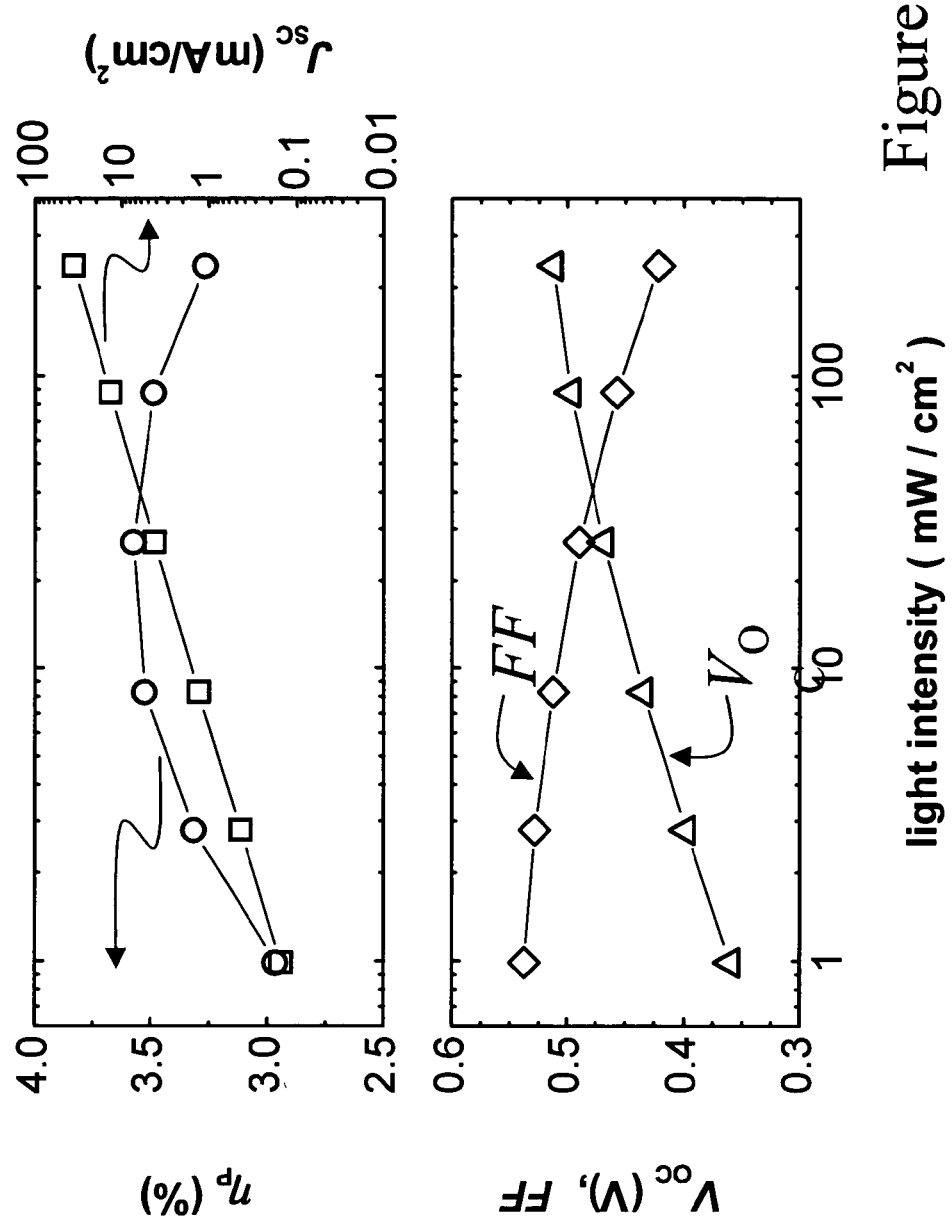
FIG. 7 shows additional photovoltaic characteristics of the device described with reference to FIG. 6.

FIG. 7 shows additional photovoltaic characteristics of the device described with reference to FIG. 6. $J_{SC}$ linearly increases with incident light intensity ($P_O$), with a responsivity of (0.15±0.07) A/W. Also, $V_{OC}$ increases and FF decreases with increasing $P_O$. As a result, $\eta_P$ is almost constant at all light intensities between 0.01 and 2.4 suns, with a maximum of $\eta_P$=(3.6±0.2) %, and $J_{SC}$=(4.2±0.1) mA/cm$^2$, $V_{OC}$=0.47 V and FF=0.49, under 0.3 sun illumination. At higher intensities, FF decreases to 0.42, resulting in $\eta_P$=(3.3±) % at 2.4 suns.

Although $R_S$ may affect the J-V characteristics at high intensities, the small $R_S$=0.25Ω·cm$^2$ for the mixed device results in a voltage drop under short circuit conditions of only $J_{SC}·R_S$=10 mV at 2.4 suns. This voltage drop, in turn, is estimated to reduce $\eta_P$ by smaller than 0.1% compared to an ideal device ($R_S$=0Ω·cm$^2$). Recently reported results employing a ZnPc:C$_{60}$ mixed layer structure, see D. Gebehu et al., Solar Energy Mater. Solar Cells, 79, 81 (2003) and the ZnPc entry in Table 2, shows comparable $\eta_P$ with similar photovoltaic characteristics to some devices with mixed layers under lower (~1/10 sun) intensity, but with a significant decrease of $J_{SC}$ and FF at 1 sun, resulting in a smaller $\eta_P$ (see Table 2). This reduction in $\eta_P$ may be due to the large $R_S$ (40-60Ω·cm$^2$) of the former device.

Recently, structures similar to those in Table 2 have been reported by Sullivan, et al., Appl. Phys. Lett., 84, 1210 (2004), although the efficiencies of those devices are ~3 times lower than certain devices disclosed herein. Peumans, et al., J. Appl. Phys., 93, 3693, have shown that efficiency decreases exponentially with blocking (BCP) layer thickness once the layer exceeds the "damage thickness" induced during contact deposition. The BCP layers of Sullivan are 120 Å, apparently exceeding the damage thickness. Furthermore, we have also found that material purity is extremely important in determining PV cell efficiency. For devices fabricated by the inventors and described herein, all sources of materials have been sublimed at least three times prior to use in fabricating the devices.

FIG. 8 shows absorption spectra of CuPc:C$_{60}$ films with various mixture ratios, deposited on ITO. The concentrations of CuPc in mixed films are (a) 100% (CuPc single layer), (b) 62%, (c) 40%, (d) 33% and (e) 21%. The pure CuPc film has two peaks centered at wavelengths of 620 nm and 695 nm. The longer wavelength peak is due to molecular Frenkel exciton generation, whereas the shorter wavelength feature is attributed to the formation of CuPc aggregates. The longer wavelength peak is dominant in the gas phase or dilute solution. FIG. 8 shows that the magnitude of the longer wavelength peak increases with increasing $C_{60}$ content. Accordingly, CuPc molecules show a lower tendency to aggregate with increasing $C_{60}$ content. This suggests that an increase in $C_{60}$ concentration inhibits CuPc aggregation, thereby reducing hole transport in the mixed film, perhaps leading to a low carrier collection efficiency. This is reflected in the reduced power efficiency ($\eta_P$=(2.6±0.1) %, see Table 2) of a CUPC: $C_{60}$ (1:2) mixed layer PV cell. However, at a concentration of 1:1, there may be sufficient aggregation (albeit not measurable aggregation) of CuPc molecules, and/or the formation of CuPc "strings" or percolation paths, to allow for low resistance hole transport. The much higher symmetry $C_{60}$ molecules may also form a percolation path for efficient electron transport to the cathode. At the present time, it is believed that a ratio of 1.2:1 (by weight) CuPc/$C_{60}$ is most preferred, although other concentrations may be used.

Figure 9:
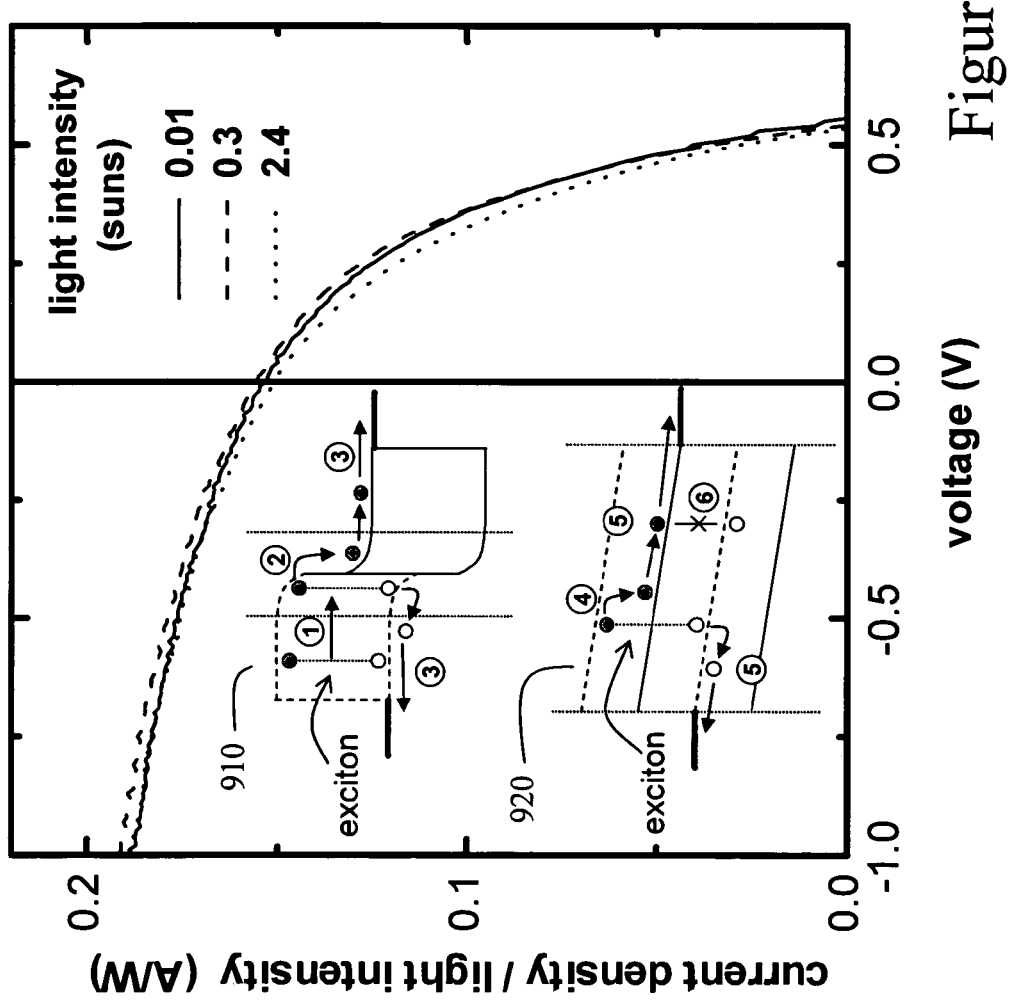
FIG. 9 shows normalized photocurrent—voltage characteristics under various light intensities for the devices described with respect to FIG. 6.

FIG. 9 shows normalized photocurrent—voltage characteristics under various light intensities for the devices described with respect to FIG. 6. The current densities are normalized by subtracting the dark current, and then dividing the AM1.5G light intensity. FIG. 9 also shows proposed photovoltaic processes for both bilayer and mixed layer devices. In a bilayer device 910, photogenerated excitons migrate to a D-A interface (1), where they separate into charge carriers in the built-in depletion region (2), followed by sweep out through the neutral region by diffusion assisted by the carrier concentration gradient (3). In a mixed layer device 920, excitons are separated immediately into charge carriers at the D-A couple (4). The charge carriers then proceed towards the electrodes by drift under the built-in electric field (5), with some undergoing loss due to recombination (6).

In a bilayer cell, photons may not contribute to the photocurrent if they are absorbed too far from a D-A interface. The distance that is "too far" is related to the exciton diffusion length ($L_D$). The external quantum efficiency ($\eta_{EQE}$) as well as the absorption efficiency of a bilayer device are limited by the efficiency for exciton diffusion to the D-A junction ($\eta_{ED}$). In a mixed device, on the other hand, $\eta_{ED}$ is high (~100%) because all excitons are generated at the D-A molecular couple, and hence readily dissociate. This suggests that mixed devices are not restricted by the small $L_D$ characteristic of organic thin films. Therefore, $J_{SC}$=15.4 mA/cm² of a mixed device at 1 sun is larger than $J_{SC}$=11.3 mA/cm² of the optimized bilayer device. See, Xue et al., Appl. Phys. Lett., 84, 3013 (2004). However, the mixed device shows a large electric field dependence in the J-V characteristics (see FIG. 9), resulting in a smaller FF, and hence a smaller power conversion efficiency than the bilayer device.

Electron-hole recombination may be more likely in a mixed layer device since charge separation away from the exciton dissociation site is made difficult by the high resistance of the mixed layer. However, the J-V characteristics under different irradiation intensities in FIG. 9 show that the normalized photocurrent is not significantly reduced, even at high intensity (and hence higher carrier concentrations), suggesting that bimolecular recombination of photogenerated carriers is not significant in the mixed layer. Because carrier generation occurs across the entire mixed layer, the carrier concentration gradient is very small, suggesting that the diffusion component to the total current is also small. Thus the current within the mixed layer is primarily driven by drift and may be strongly affected by an applied electric field (see FIG. 9, device 910). On the other hand, in a bilayer device, photogenerated carriers at the D-A interface diffuse across the neutral region (See FIG. 9, device 920). This process is assisted by a large charge concentration gradient extending from the D-A interface to the electrodes, resulting in a relatively small electric field dependence.

Another hybrid photovoltaic cell was fabricated, having the structure: indium-tin-oxide/150 Å CuPc/100 Å CUPC: $C_{60}$ (1:1 by weight)/350 Å $C_{60}$/100 Å bathocuproine/1000 Å Ag. This photovoltaic cell exhibited a maximum power conversion efficiency of (5.0±0.2) % under 1 to 4 suns of simulated AM1.5G solar illumination.

Devices were fabricated as follows: Organic hybrid HJ PV cells were fabricated on glass substrates precoated with a ~1500 Å thick transparent, conducting ITO anode with a sheet resistance of 15 .OMEGA./sq, obtained from Applied Film Corp, Boulder, Colo., 80301. The substrates were cleaned in solvent as described in Burrows et al., J. Appl. Phys. 79, 7991 (1996). The substrate were then treated by UV-ozone for 5 minutes, as described in Xue et al., J. Appl. Phys. 95, 1869 (2004). The organic layers and a metal cathode were deposited via thermal evaporation in a high vacuum chamber with a base pressure ~2×10⁻⁷ Torr. A CuPc layer was deposited on the ITO anode, followed by a co-deposited, homogenously mixed layer of CuPc:$C_{60}$ (1:1 by weight), followed by a $C_{60}$ layer. Various devices were fabricated, having different thicknesses of the organic layers. The CuPc layer thickness was varied between $d_D$~50-200 Å. The co-deposited, homogenously mixed layer of CuPC:$C_{60}$ (1:1 by weight) thickness was varied between $d_m$~300 Å. The $C_{60}$ layer thickness was varied between $d_A$~250-400 Å. After the $C_{60}$ was deposited, a 100 Å. thick exciton-blocking layer of BCP was deposited. Finally, a 1000 Å. thick Ag cathode was evaporated through a shadow mask with 1 mm diameter openings. For devices having $d_m$ greater than zero, the devices appear as illustrated in device 1010, i.e., the devices are similar to those of FIG. 3, where third organic layer 310 is CuPc, first organic layer 306 is a mixture of CuPc and $C_{60}$, second organic layer 308 is $C_{60}$, and fourth organic layer 314 is BCP.

Current-voltage characteristics of the PV cells at 25° C. in the dark or under simulated AM1.5G solar illumination from a 150 W Xe-arc lamp (Oriel Instruments) were measured using an HP 4155B semiconductor parameter analyzer. The illumination intensity was varied using neutral density filters and measured with a calibrated broadband optical power meter (Oriel Instruments). To measure the external quantum efficiency, a monochromatic beam of light was used, which was generated by passing the white light from the Xe-arc lamp through a 0.3 m monochrometer (Acton Research SpectraPro-300i) and whose intensity was determined using a calibrated Si photodetector (Newport 818-UV). With a chopping frequency of 400 Hz, the photocurrent was then measured using a lock-in amplifier (Stanford Research SR830) as a function of the incident light wavelength and the applied voltage.

Figure 10:
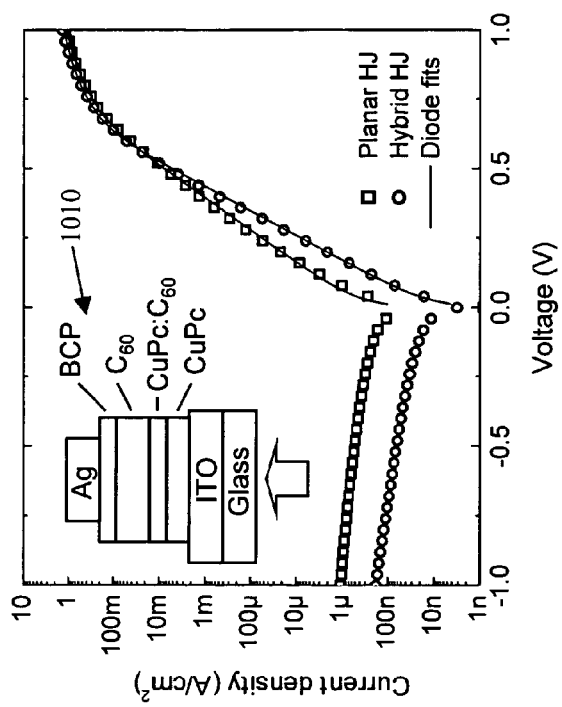
FIG. 10 shows the current density vs voltage (J-V) characteristics in the dark for a planar HJ device and a hybrid HJ device.

FIG. 10 shows the current density vs voltage (J-V) characteristics in the dark for a planar HJ ($d_D$=200 Å and $d_A$=400 Å, $d_m$=0) and a hybrid HJ ($d_D$=100 Å, $d_m$=200 Å, and $d_A$=300 Å) cell. Both cells exhibit rectification ratios>10⁶ at ±1 V, and shunt resistances>1 MΩ·cm². The forward-bias characteristics can be fit using the modified diode equation $$J = J_s \left\{ \exp\left[\frac{q(V - JR_S)}{nkT}\right] - 1 \right\}, \tag{1}$$

where $J_s$ is the reverse-bias saturation current density, n the ideality factor, $R_S$ the series resistance, q the electron charge, k the Boltzmann's constant, and T the temperature. While $R_S$ is approximately the same for both cells, ~0.25Ω·cm², n is reduced from 1.94±0.08 for the planar HJ cell to 1.48±0.05 for the hybrid HJ cell, whereas $J_s$ is also reduced from (4±1)×10⁻⁷ A/cm² (planar HJ) to (1.0±0.3)×10⁻⁸ A/cm² (hybrid HJ).

Figure 11:
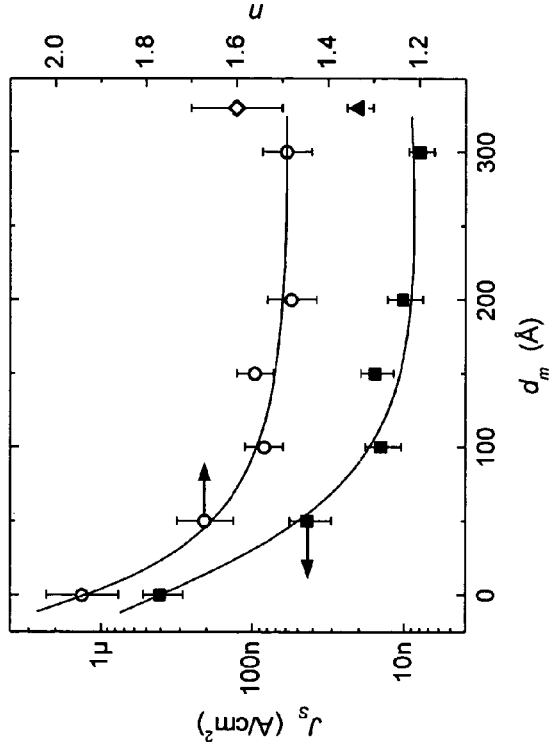
FIG. 11 shows the dependences of n and $J_s$ on the mixed layer thickness $d_m$, for hybrid HJ cells with $d_D=d_A=200$ Å$=200$ Å$-d_m/2$.

FIG. 11 shows the dependences of n and $J_s$ on the mixed layer thickness $d_m$, for hybrid HJ cells with $d_D = d_A - 200$ Å = 200 Å - $d_m/2$. With increasing $d_m$, both n (open circles) and $J_s$ (filled squares) decrease significantly at $d_m \leq 100$ Å, and tend to saturate at $d_m \geq 100$ Å.

The lower n and $J_s$ for cells with a mixed layer can be attributed to the decrease in the recombination current in the depletion region of these cells. For a planar HJ cell, due to the large energy offset (~1 eV) of the highest occupied and lowest unoccupied molecular orbitals (HOMO and LUMO, respectively) at the CuPc/C$_{60}$ interface, the diffusion-emission current is negligible; therefore, the dark current is dominated by the recombination current in the depletion region, which includes the entire mixed layer and part of the unmixed photoactive layers in contact with the mixed layer, leading to n≈2. According to the Shockley-Hall-Read recombination model, $J_s$ for the recombination current can be expressed as:

$$J_{s,rec} = \frac{qn_i W'}{2\tau} \quad (2)$$
$$= \frac{1}{2} q n_i W' N_t \sigma v_{th},$$

where $n_i$ is the intrinsic electron/hole concentration, W' is the effective depletion width, $\tau = 1/(N_t \sigma v_{th})$ is the excess carrier lifetime, $N_t$ is the total density of recombination centers, σ s the electron/hole capture cross section, and $v_{th}$ is the carrier thermal velocity. In disordered semiconductors where charge carriers transport via hopping processes, it has been shown by Paasch et al., *Synth. Met.* 132, 97 (2002), that $v_{th} \propto \mu^{1.1}$ for μ<1 cm²/V·s, where μ is the carrier mobility. Therefore, a reduction in $J_s$ in a mixed layer may occur as a result of the reduced μ in a mixed layer as compared with an unmixed layer. With a much reduced recombination current, the contribution of the diffusion-emission current to the dark current becomes appreciable, leading to 1<n<2 in cells with a mixed layer. By comparing $J_s$ for the planar HJ cell and for the hybrid HJ cells with $d_m \geq 200$ Å, it can be inferred that the hole mobility in CuPc and the electron mobility in C$_{60}$ are reduced by approximately one and a half orders of magnitude by intermixing CuPc and C$_{60}$ at a ratio of 1:1 by weight.

Figure 12:
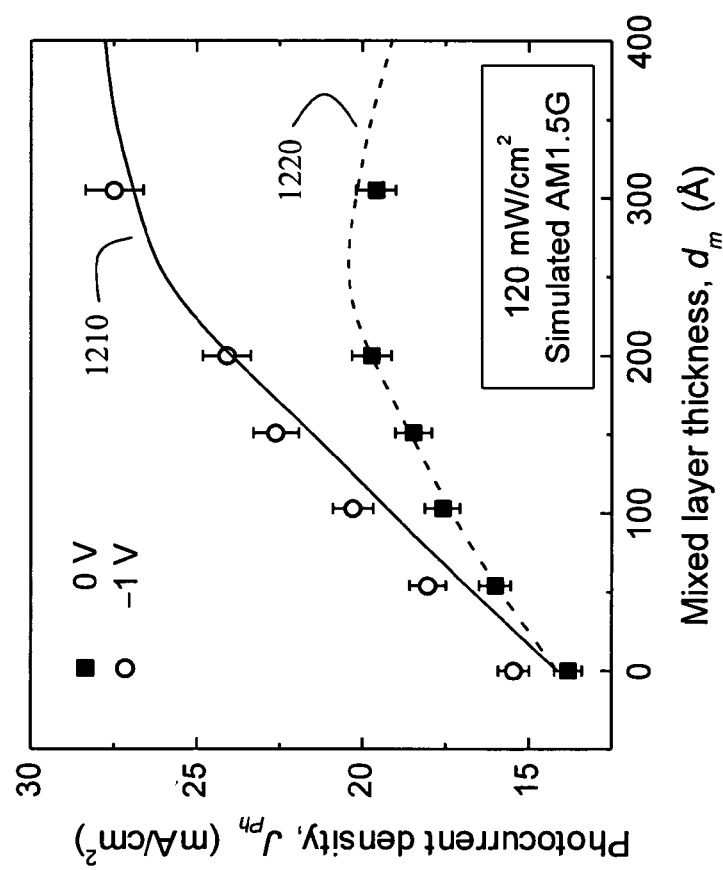
FIG. 12 shows the photocurrent density, $J_{Ph}$, at an illumination intensity of $P_O=120$ mW/cm$^2$ for hybrid devices having various mixed layer thicknesses.

FIG. 12 shows the photocurrent density, $J_{Ph}$, at an illumination intensity of $P_O=120$ mW/cm² for cells with a mixed layer having a thickness of 0 Å ≤ $d_m$ ≤ 300 Å. Again, $d_D=200$ Å − $d_m/2$ and $d_A=400$ Å − $d_m/2$. At 0 V (short circuit, filled squares), $J_{Ph}$ increases with $d_m$ for $d_m \leq 200$ Å, while remaining nearly constant as $d_m$ is further increased to 300 Å. Upon applying a bias of −1 V (open circles), $J_{Ph}$ increases significantly, more for cells with a thicker mixed layer. For the planar HJ cell, this may be attributed to field-assisted exciton dissociation away from the D-A interface. However, for the hybrid HJ cells, especially those with a thick mixed layer ($d_m \geq 150$ Å), the significant increase in $J_{Ph}$ may be attributed to an increased charge collection efficiency ($\eta_{CC}$, or fraction of photogenerated charge being collected at the electrodes) due to an increased electric field in the mixed layer, which is directly related to the poor transport property of the mixed layer.

Based on a model described by Peumans et al., *J. Appl. Phys.* 93, 3693 (2003), which considers both the optical interference effect and exciton diffusion, $J_{Ph}$ of hybrid HJ cells can be simulated as a function of the mixed layer thickness, assuming full dissociation of excitons in the mixed layer and ideal charge collection ($\eta_{CC}=1$). As shown by the solid line 1210 in FIG. 12, using an exciton diffusion length of 70 Å and 300 Å in CuPc and C$_{60}$, respectively, the model prediction is in reasonable agreement with the experimental data at −1 V. The discrepancy at $d_m \leq 150$ Å may be attributed to the field-assisted exciton dissociation in the mixed layers, which is not taken into consideration in model used to generate line 1210.

To account for the limited $\eta_{CC}$ in hybrid HJ cells, a model may be used that assumes an electron (or a hole) in the mixed layer at a distance x away from the mixed layer/C$_{60}$ (or CuPc) unmixed layer interface has a probability of P(x)=exp(−x/L) reaching the mixed layer/unmixed layer interface, where it is transported through the unmixed layer and collected at the electrode. L is a characteristic length for carrier transport. Then, the overall charge collection efficiency is:

$$\eta_{CC} = \int p(x)P(x)dx \bigg/ \int p(x)dx \quad (3)$$
$$= \frac{L}{d_m}\left[1 - \exp\left(-\frac{d_m}{L}\right)\right],$$

if $$p(x) = \text{constant},$$

where p(x) is the hole concentration. The photocurrent density $J_{Ph}$ can be obtained by multiplying $\eta_{CC}$ with the results from the model described in the previous paragraph and used to generate line 1210, which corresponds to $\eta_{CC}=1$. Fitting the experimental data of $J_{Ph}$ at 0 V using the model described in this paragraph, dashed line 1220 is generated, and a characteristic charge transport length of L=450 Å±50 Å is obtained.

The characteristic charge transport length L can be considered as the average distance an electron or a hole travels in the mixed layer under an electric field before being recombined. Hence, L can be expressed as $$L = \tau\mu(V_{bi}-V)|W \approx L_0(V_{bi}-V)|V_{bi}, \quad (4)$$

where τ is the carrier lifetime, μ is the carrier mobility, $V_{bi}$ is the built-in potential, W is the depletion width, and $L_0=\tau\mu V_{bi}/W=L(V=0)$. The approximation is made if W does not change significantly with the bias voltage. The charge collection efficiency $\eta_{CC}$ now becomes a function of V through the voltage dependence of L, such that:

$$J_{Ph}(V) = P_O R_0 \eta_{CC}(V), \quad (5)$$

where $R_0$ is the responsivity corresponding to $\eta_{CC}=1$. The total current density is a sum of $J_{Ph}$ and the dark current density described by Eq. (1). FIG. 13 shows the experimental J-V characteristics at various $P_O$ for a hybrid HJ cell with $d_m=200$ Å. Using the results for $J_s$, n, and $R_S$ from the dark current analysis and $V_{bi}=0.6$ V, it may be calculated that $L_0=400$ Å±50 Å and $R_0=(0.22±0.02)$ A/W by fitting the data at −1 V<V<0.6 V. $L_0$ obtained here is in agreement with the fitting result on the short-circuit current density.

Figure 14:
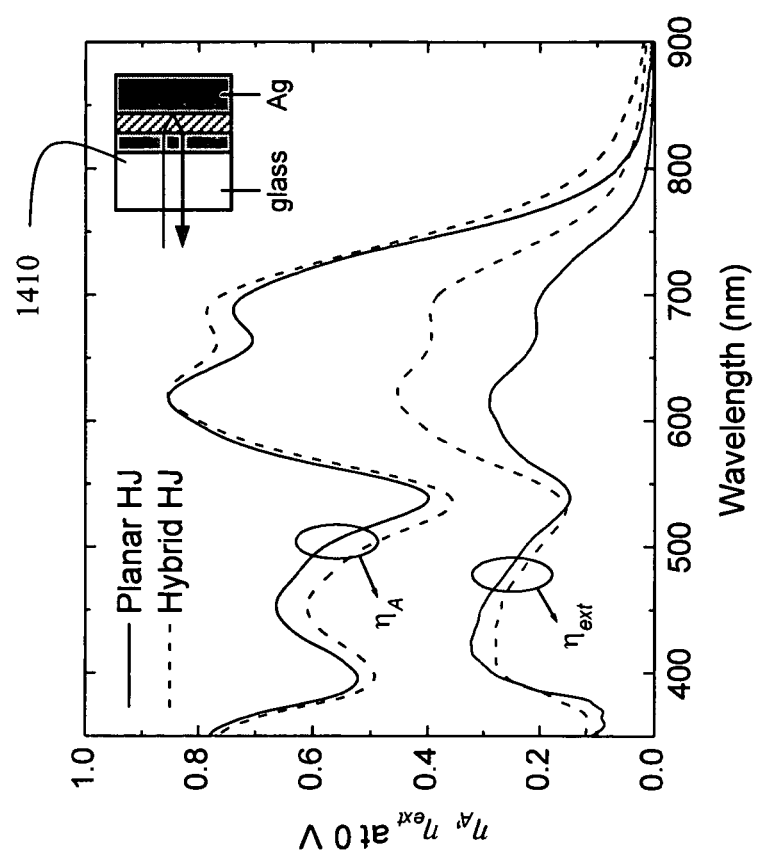
FIG. 14 shows absorption spectra of a planar HJ device and a hybrid HJ device with a mixed layer thickness of 200 Å.

FIG. 14 shows absorption spectra of the planar HJ cell (solid line) and the hybrid HJ cell with $d_m=200$ Å (dashed line). The absorption efficiency $\eta_A=1-R$, where R is the reflectance of light incident through the glass substrate with a Ag cathode on top of the organic layers (see structure 1410).

The slight difference in the absorption spectra for these two devices can be attributed to the different material density profile and the interference-induced non-uniform distribution of the optical field intensity across the thickness of the organic layers, in addition to the different aggregation states of CuPc in the MCL and PCL.

Also shown in FIG. 14 are the external quantum efficiencies, $\eta_{ext}$, at 0 V for a planar HJ (solid line) and a hybrid HJ (dashed line). The hybrid HJ cell has a much higher $\eta_{ext}$ in the spectral region between 550 nm and 750 nm, corresponding to CuPc absorption, whereas in the $C_{60}$ absorption region (380 nm to 530 nm), $\eta_{ext}$ is slightly lower in the hybrid HJ cell as a result of a slightly lower $\eta_A$. Therefore, the internal quantum efficiency, $\eta_{int}=\eta_{ext}/\eta_A$, is significantly enhanced in the CuPc absorption region for the hybrid HJ cell as compared to the planar HJ cell, while it is nearly the same in the spectral region where $C_{60}$ absorption dominates. This is consistent with the different exciton diffusion lengths in CuPc ($L_D$~100 Å) and $C_{60}$ ($L_D$~400 Å), considering that in the planar HJ cell, $d_D$=200 Å~$2L_D$, while $d_A$=400 Å~$L_D$. Both the quantum efficiency and the absorption spectra of the hybrid HJ cell show a long-wavelength tail extending from 800 nm to 900 nm, far beyond the absorption edge of CuPc (~750 nm). This is attributed to charge transfer state absorption in the CuPc:$C_{60}$ mixture, similar to that observed in the Zn phthalocyanine:$C_{60}$ mixed system. See G Ruani et al., *J Chem. Phys.* 116, 1713 (2002).

Figure 15:
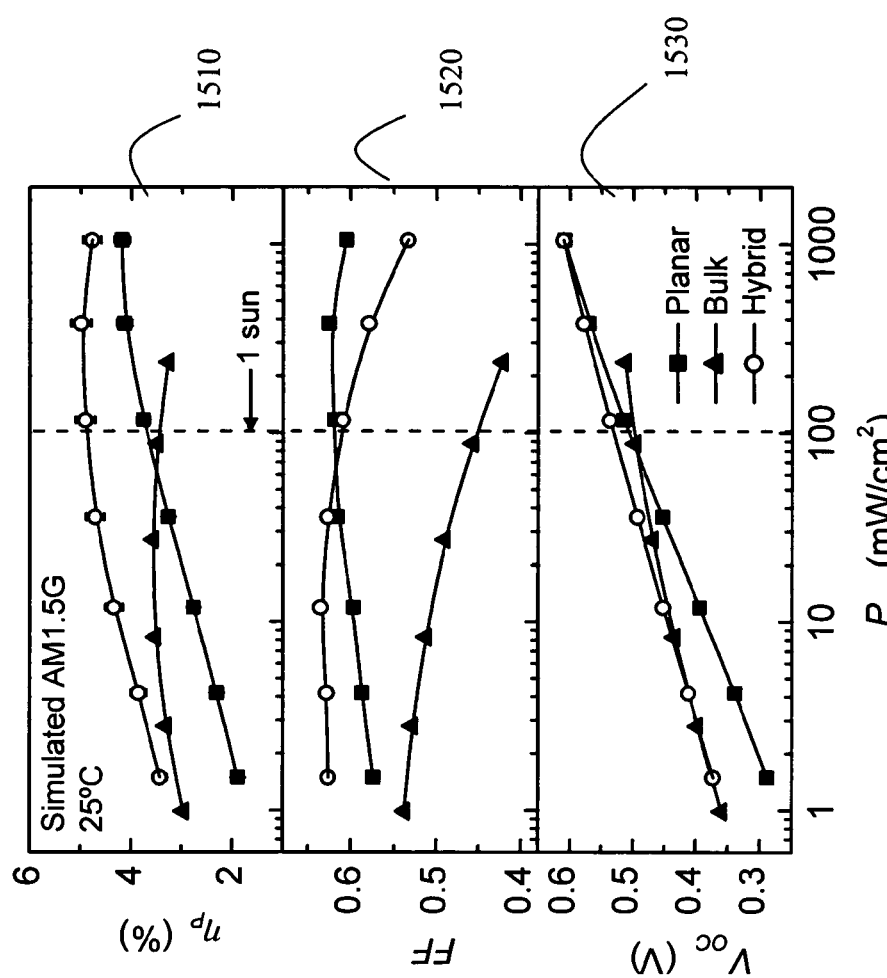
FIG. 15 shows the illumination intensity dependences of $\eta_P$, FF, and $V_{OC}$ for hybrid HJ devices and a planar HJ device.

FIG. 15 shows the illumination intensity dependences of $\eta_P$, FF, and $V_{OC}$ for a hybrid HJ cell (open circles) with the structure of ITO/CuPc(150 Å)/CuPc:$C_{60}$ (100 Å, 1:1 by weight)/$C_{60}$ (350 Å)/BCP(100 Å)/Ag(1000 Å). Also shown are previously reported results for a planar HJ cell from Xue et al., *Appl. Phys Lett.* 84, 3013 (2004) (filled squares) and the hybrid HJ cell of FIG. 6 (filled triangles). All three cells show a linear dependence of $J_{SC}$ on $P_O$ over the entire range of $P_O$ used in the experiments. At 1 sun (=100 mW/cm$^2$), $J_{SC}$=(11.8±0.5), (15.5±0.5), and (15.0±0.5) mA/cm$^2$ for the planar, bulk, and hybrid HJ cell, respectively. The higher photocurrent obtained in the bulk and planar HJ cells may be a result of more favorable exciton diffusion in the mixed layer compared with the unmixed layers. The hybrid HJ cell has almost the same $J_{SC}$ as the bulk HJ cell despite only using a very thin mixed layer. Except at the highest intensities, $V_{OC}$ increases logarithmically with $P_O$ for all three cells, which can been explained using p-n junction theory. See, Xue et al., *Appl. Phys. Lett.*, 84, 3013 (2004). The different slope of $V_{OC}$ to log($P_O$) is due to the different ideality factor of these diodes: n≈2 for the planar HJ cell, and n≈1.5 for both the bulk and planar HJ cells.

The planar HJ cell has a high FF~0.6 as a result of the low $R_S$ and good transport property of the unmixed layers. The FF is significantly reduced for the bulk HJ cell, especially under high intensities, e.g., FF=0.45 at 1 sun, compared with FF=0.62 for the planar HJ cell. With a much thinner mixed layer than in the bulk HJ structure (100 Å vs 330 Å), the hybrid HJ cell shows FF≥0.6 at $P_O$≤1 sun and only slightly reduced to 0.53 at an intense illumination of ~10 suns, indicating the much improved charge transport property.

Overall, the hybrid HJ cell has a maximum efficiency of $\eta_P$=(5.0±0.2) % at 120 mW/cm$^2$≤$P_O$≤380 mW/cm$^2$ (see panel 1510). Decreasing the illumination intensity below 1 sun leads to a decrease in $\eta_P$ due to the reduction in $V_{OC}$. Increasing the intensity above 4 suns also causes a slight reduction in $\eta_P$ as a result of the reduced FF. Such interplay between the dependences of $V_{OC}$ and FF on $P_O$ leads to a maximum of $\eta_P$ at an illumination intensity that can be tuned between a fraction of a sun and a few suns by varying the mixed layer thickness. With a thicker mixed layer in the hybrid HJ structure, the FF decreases more significantly with $P_O$, leading to $\eta_P$ peaking at lower intensities. For cells with a very thin mixed layer ($d_m$≤50 Å), the cell series resistance may be factor that limits FF under intense illuminations. For example, $\eta_P$ for a hybrid HJ cell with $d_m$=50 Å reaches the maximum at $P_O$ 4-10 suns, whereas it peaks at 0.4 sun≤$P_O$≤1.2 sun for a cell with $d_m$=150 Å.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device for generating photocurrent by absorbing photons, comprising:
    a first electrode;
    a second electrode;
    a photoactive region disposed between the first electrode and the second electrode, the photoactive region comprising:
        a first photoactive organic layer for generating excitons by absorbing photons comprising a homogeneous mixture of a small molecule organic acceptor material and a small molecule organic donor material, wherein the first photoactive organic layer has a thickness not greater than 0.8 characteristic charge transport lengths;
        a second photoactive organic layer for generating excitons by absorbing photons in direct contact with the first photoactive organic layer, wherein the second photoactive organic layer comprises an unmixed layer of the small molecule organic acceptor material of the first photoactive organic layer, and the second photoactive organic layer has a thickness not less than about 0.1 absorption lengths; and
        a third photoactive organic layer for generating excitons by absorbing photons disposed between the first electrode and the second electrode, the third photoactive organic layer being in direct contact with the first photoactive organic layer, wherein the third photoactive organic layer comprises an unmixed layer of the small molecule organic donor material of the first photoactive organic layer, and the third photoactive organic layer has a thickness not less than about 0.1 optical absorption lengths,
    wherein the series resistance between the first and second electrodes is less than 0.4 Ωcm$^2$.

2. The device of claim 1, wherein the first photoactive organic layer has a thickness not greater than 0.3 characteristic charge transport lengths.

3. The device of claim 1, wherein the device has a power efficiency of 2% or greater.

4. The device of claim 1, wherein the device has a power efficiency of 5% or greater.

5. The device of claim 1, wherein the second photoactive organic layer has a thickness not less than about 0.2 optical absorption lengths.

6. The device of claim 1, wherein the mixture of the small molecule organic acceptor material and the organic donor material in the first photoactive organic layer occurs in a ratio ranging from about 10:1 to about 1:10, respectively.

7. The device of claim 1, wherein the small molecule organic acceptor material is selected from the group consisting of: fullerenes, perylenes, catacondensed conjugated molecular systems, pyrene, coronene, and functionalized variants thereof.

8. The device of claim 7, wherein the catacondensed conjugated molecular systems include linear polyacenes.

9. The device of claim 1, wherein the small molecule organic donor material is selected from the group consisting of: metal containing porphyrins, metal-free porphyrins, rubrene, metal containing phthalocyanines, metal-free phthalocyanines, diamines, and functionalized variants thereof, including naphthalocyanines.

10. The device of claim 1, wherein the first photoactive organic layer consists essentially of a mixture of CuPc and $C_{60}$.

11. The device of claim 1, further comprising a first non-photoactive organic layer disposed between the second electrode and the second organic layer.

12. The device of claim 11, wherein the first non-photoactive organic layer comprises 2,9-dimethyl-4,7-diphenyl-1,10-phenanthrolin (BCP).

13. The device of claim 11, wherein the first non-photoactive organic layer is an exciton blocking layer.

14. The device of claim 1, wherein the first electrode is comprised of indium tin oxide.

15. The device of claim 1, wherein the second electrode is comprised of metal or metals selected from the group consisting of Ag, LiF/Al, Mg:Ag, and Ca/Al.

16. The device of claim 1, wherein the series resistance between the first and second electrodes is in the range of about $0.25\ \Omega cm^2 \pm 0.15\ \Omega cm^2$.

17. The device of claim 1, wherein the device is a tandem solar cell.

18. The device of claim 1, wherein the device is a solar cell.

19. The device of claim 1, wherein the device is a photodetector.

* * * * *